(12) United States Patent
Kim

(10) Patent No.: US 9,978,828 B2
(45) Date of Patent: May 22, 2018

(54) DISPLAY DEVICE HAVING A MULTI-LAYERED FILLING PATTERN

(71) Applicant: SAMSUNG DISPLAY CO., LTD., Yongin-si, Gyeonggi-do (KR)

(72) Inventor: Donggyu Kim, Yongin-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days. days.

(21) Appl. No.: 15/187,824

(22) Filed: Jun. 21, 2016

(65) Prior Publication Data

US 2017/0125508 A1 May 4, 2017

(30) Foreign Application Priority Data

Oct. 29, 2015 (KR) .......................... 10-2015-0151348

(51) Int. Cl.
*H01L 27/32* (2006.01)
*H01L 51/50* (2006.01)
(Continued)

(52) U.S. Cl.
CPC ........ *H01L 27/3279* (2013.01); *H01L 51/504* (2013.01); *H01L 51/525* (2013.01);
(Continued)

(58) Field of Classification Search
CPC . H01L 27/3279; H01L 27/322; H01L 51/504; H01L 51/5206; H01L 51/5221;
(Continued)

(56) References Cited

U.S. PATENT DOCUMENTS 6,870,186 B2 * 3/2005 Park .................... H01L 27/3253
257/40
7,583,023 B2 * 9/2009 Park .................... H01L 51/5259
313/501
(Continued)

FOREIGN PATENT DOCUMENTS

JP 2007-207460 A 8/2007
KR 10-2010-0071704 A 6/2010
(Continued)

*Primary Examiner* — Ida M Soward
(74) *Attorney, Agent, or Firm* — Lee & Morse, P.C.

(57) ABSTRACT

A display device includes an organic electroluminescent area on the first base substrate, a second base substrate on the organic electroluminescent area and including a light emitting area and a non-light emitting area, a base layer between the organic electroluminescent area and the second base substrate, a conductive layer between the base layer and the organic electroluminescent area, and a filling pattern between the base layer and the conductive layer and overlapping a portion of the conductive layer. The conductive layer overlaps the light emitting area and the non-light emitting area, covers the filling pattern, and contacts the base layer. A portion of the conductive layer may contact the organic electroluminescent area. The filling pattern includes a first filling pattern having an insulating material and a second filling pattern on the first filling pattern. The second filling pattern has a conductive material with a lower resistance than the conductive layer.

16 Claims, 19 Drawing Sheets

(51) Int. Cl.
   *H01L 51/52* (2006.01)
   *H01L 51/56* (2006.01)

(52) U.S. Cl.
   CPC ...... *H01L 51/5206* (2013.01); *H01L 51/5221* (2013.01); *H01L 51/5228* (2013.01); *H01L 51/5237* (2013.01); *H01L 51/56* (2013.01); *H01L 27/322* (2013.01); *H01L 27/3209* (2013.01); *H01L 51/5284* (2013.01); *H01L 2227/323* (2013.01); *H01L 2251/301* (2013.01); *H01L 2251/5315* (2013.01)

(58) Field of Classification Search
   CPC .. H01L 51/5237; H01L 51/5284; H01L 51/56
   See application file for complete search history.

(56) References Cited

U.S. PATENT DOCUMENTS

| | | | | |
|---|---|---|---|---|
| 7,705,532 | B2* | 4/2010 | Yoo | H01L 27/3246 |
| | | | | 313/504 |
| 7,811,147 | B2* | 10/2010 | Kim | H01L 27/3251 |
| | | | | 313/504 |
| 7,928,646 | B2* | 4/2011 | Ryuji | H01L 27/322 |
| | | | | 313/501 |
| 8,164,258 | B2* | 4/2012 | Hayashi | H01L 51/5253 |
| | | | | 313/512 |
| 9,123,674 | B2* | 9/2015 | Yamakita | H01L 51/5228 |
| 9,425,241 | B2* | 8/2016 | Yamakita | G02B 5/201 |
| 9,496,318 | B2* | 11/2016 | Cheng | H01L 27/326 |
| 2005/0212413 | A1* | 9/2005 | Matsuura | H01L 27/322 |
| | | | | 313/504 |
| 2010/0001965 | A1* | 1/2010 | Wang | G06F 3/045 |
| | | | | 345/173 |
| 2010/0096655 | A1* | 4/2010 | Lee | H01L 27/3253 |
| | | | | 257/98 |
| 2010/0102716 | A1* | 4/2010 | Kim | C09K 11/06 |
| | | | | 313/504 |
| 2011/0207249 | A1* | 8/2011 | Chae | H01L 27/3253 |
| | | | | 438/23 |
| 2015/0115234 | A1* | 4/2015 | Hong | H01L 51/525 |
| | | | | 257/40 |
| 2015/0243711 | A1* | 8/2015 | Hong | H01L 27/323 |
| | | | | 257/40 |
| 2015/0318339 | A1* | 11/2015 | Nakamura | H01L 27/3262 |
| | | | | 257/98 |
| 2015/0362776 | A1* | 12/2015 | Jikumaru | H01L 27/124 |
| | | | | 349/12 |
| 2016/0079333 | A1* | 3/2016 | Shishido | H01L 27/3218 |
| | | | | 257/72 |
| 2016/0225831 | A1* | 8/2016 | Ito | H01L 27/323 |

FOREIGN PATENT DOCUMENTS

| | | | |
|---|---|---|---|
| KR | 20110076366 A | * | 7/2011 |
| KR | 10-2014-0143635 A | | 12/2014 |
| KR | 10-2015-0037516 A | | 4/2015 |
| KR | 10-2015-0043142 A | | 4/2015 |
| KR | 10-2015-0054125 A | | 5/2015 |

* cited by examiner

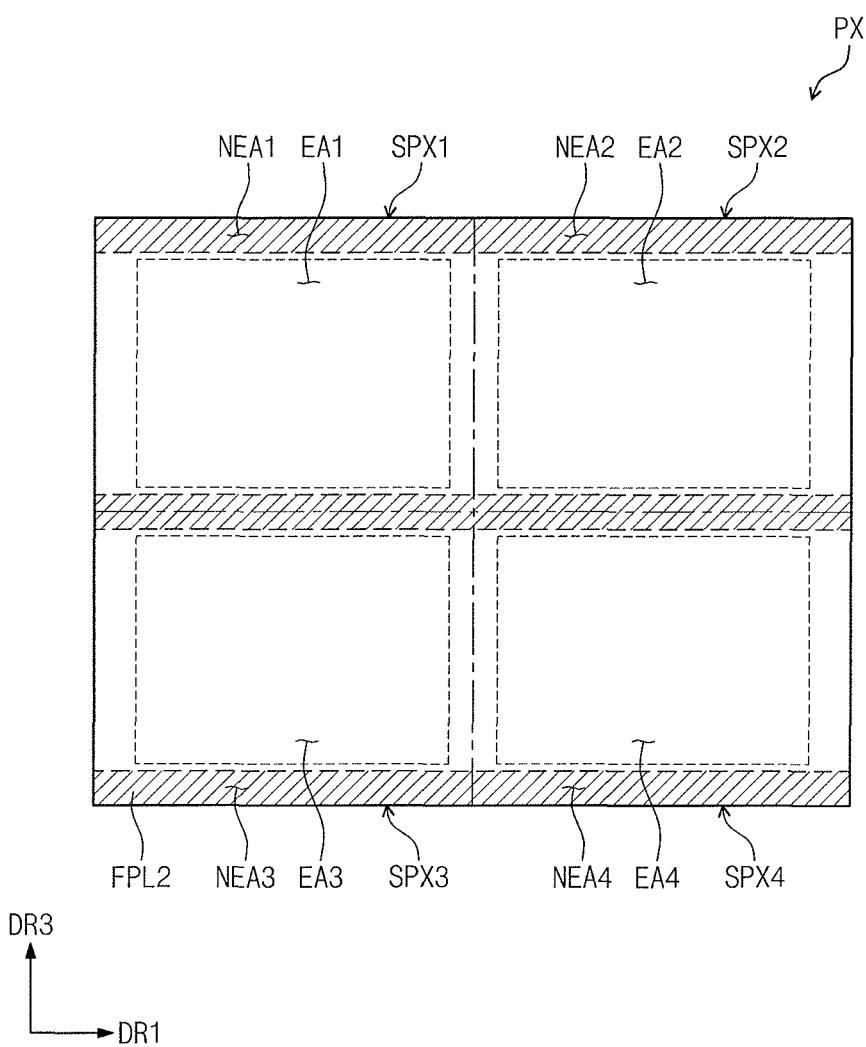

DISPLAY DEVICE HAVING A MULTI-LAYERED FILLING PATTERN

CROSS-REFERENCE TO RELATED APPLICATION

Korean Patent Application No. 10-2015-0151348, filed on Oct. 29, 2015, and entitled, "Display Device and Method for Fabricating the Same," is incorporated by reference herein in its entirety.

BACKGROUND

1. Field

One or more embodiments described herein relate to a display device and a method for fabricating a display device.

2. Description of the Related Art

A flat display device may be classified as an emissive type or a non-emissive type. Examples of emissive-type displays include flat cathode ray tubes, plasma display panels, and an organic light emitting displays. An organic light emitting display is self-emissive with a large viewing angle, excellent contrast, and fast response time.

Accordingly, organic light emitting displays may be used in mobile devices, e.g., smartphones, ultra-slim notebook computers, tablet personal computers, and flexible display devices. Organic light emitting displays may also used in large-scale electronic products, e.g., ultra-slim televisions.

Organic light emitting displays emit color light based on a recombination of holes and electrons in a light emitting layer located between an anode and cathode.

SUMMARY

In accordance with one or more embodiments, a display device including a first base substrate; an organic electroluminescent area on the first base substrate; a second base substrate on the organic electroluminescent area and including a light emitting area and a non-light emitting area; a base layer between the organic electroluminescent area and the second base substrate; a conductive layer between the base layer and the organic electroluminescent area; and a filling pattern between the base layer and the conductive layer and overlapping a portion of the conductive layer. The conductive layer overlaps the light emitting area and the non-light emitting area, covers the filling pattern, and contacts the base layer, a portion of the conductive layer contacts the organic electroluminescent area, and the filling pattern includes a first filling pattern including an insulating material and a second filling pattern on the first filling pattern, the second filling pattern including a conductive material having a lower resistance than the conductive layer. The insulating material may includes a photoresist.

The conductive material may include at least one of a metal or a metal alloy. The conductive material may include at least one of aluminum (Al), copper (Cu), or silver (Ag), or includes an alloy thereof. The conductive layer may include a transparent conductive oxide.

The filling pattern may be spaced apart from the light emitting area and may overlap the non-light emitting area. The width of the filling pattern may be less than the width of the non-light emitting area.

The conductive layer may include a first conductive area protruding from the base layer toward the first base substrate and accommodating the filling pattern; and a second conductive area connected to the first conductive part. At least a portion of the first conductive area may contact the organic electroluminescent area, and the second conductive area may be spaced apart from the organic electroluminescent area.

The organic electroluminescent area may include an anode; a light emitter on the anode to emit white light; and a cathode on the light emitter, wherein the portion of the conductive layer contacts the cathode. The light emitter may include a first light emitting layer; a charge generating layer on the first light emitting layer; and a second light emitting layer on the charge generating layer. The light emitter may include a first light emitting layer; a charge generating layer on the first light emitting layer; a second light emitting layer on the charge generating layer; and a third light emitting layer on the second light emitting layer and contacting the second light emitting layer. The light emitter may include a first light emitting layer; a first charge generating layer on the first light emitting layer; a second light emitting layer on the first charge generating layer; a second charge generating layer on the second light emitting layer; and a third light emitting layer on the second charge generating layer.

The organic electroluminescent area may emit white light. The base layer may include at least one of a color filter layer or an overcoat layer. The base layer may include a color filter layer that has a color filter and a black matrix, at least a portion of the filling pattern overlapping the black matrix.

In accordance with one or more other embodiments, a method for fabricating a display device includes preparing a first base substrate and an organic electroluminescent area on the first base substrate; preparing a second base substrate including a light emitting area and a non-light emitting area; providing a filling pattern on the second base substrate; and providing a conductive layer on the second base substrate to cover the filling pattern, wherein providing the filling pattern includes: providing a first layer on the second base substrate, the first layer including an insulating material; providing a second layer on the first layer, the second layer including a conductive material having a lower resistance than the conductive layer; patterning the second layer; and patterning the first layer, wherein, providing the filling pattern includes providing the filling pattern to be spaced apart from the light emitting area and to overlap a portion of the non-light emitting area. Providing the first layer may be performed by applying at least one of a metal or a metal alloy. Providing the second layer may be performed by applying a photoresist. The conductive layer may include a transparent conductive oxide.

BRIEF DESCRIPTION OF THE DRAWINGS

Features will become apparent to those of skill in the art by describing in detail exemplary embodiments with reference to the attached drawings in which:

FIGS. 7A and 7B illustrate an example of a positional relationship in a filling pattern in a display device according to one embodiment;

DETAILED DESCRIPTION

Figure 1:
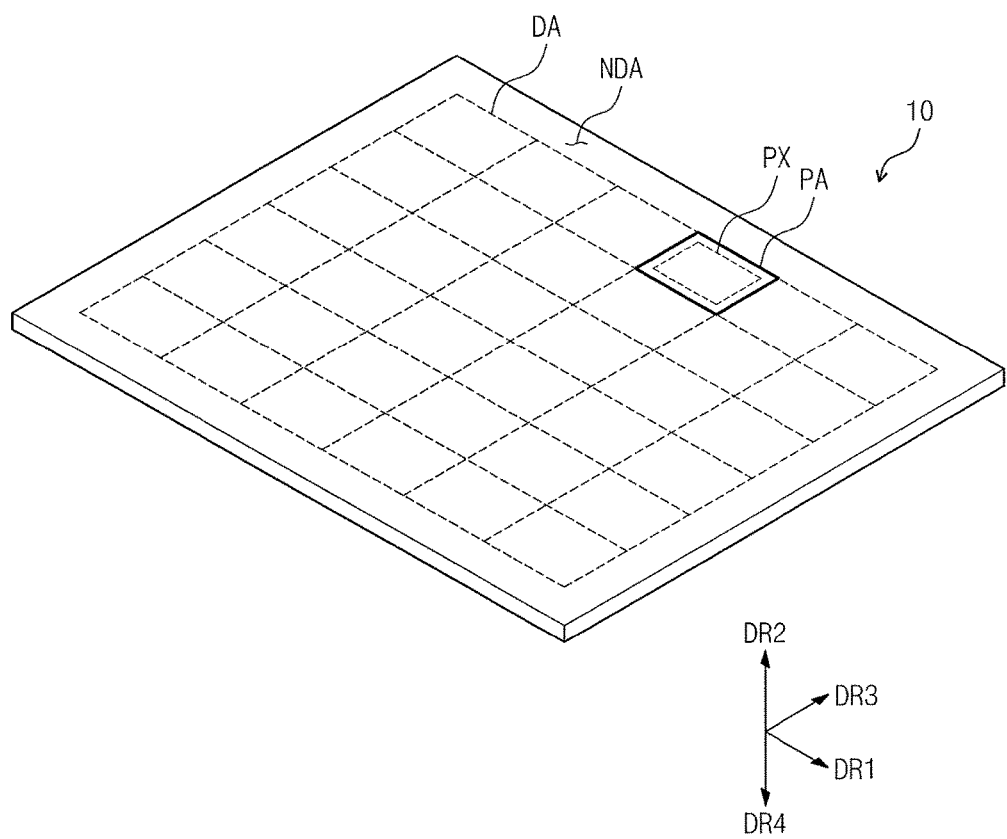
FIG. 1 illustrates an embodiment of a display device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. Moreover, it will be understood that when a part such as a layer, a film, an area, a plate, etc. is referred to as being "on" another part, it can be "directly on" the other part, or intervening parts may be present. In addition, when a part such as a layer, a film, an area, a plate, etc. is referred to as being "below" another part, it can be "directly below" the other part, or intervening parts may be present.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a display device 10 which includes a display area DA and a non-display area NDA. The display area DA displays an image. When viewed from the thickness direction (for example, DR4) of the display device 10, the display area DA may have a roughly rectangular shape or another shape.

The display area DA includes a plurality of pixel areas PA arranged in the form of a matrix. A plurality of pixels PX are in the pixel areas PA. Each pixel PX includes an organic electroluminescent device or area (e.g., OEL in FIG. 5A) and a plurality of subpixels (e.g., SPX in FIG. 2A). Each subpixel may include a sub-organic electroluminescent device or area (e.g., S_OEL in FIG. 2A).

The non-display area NDA does not display an image. When viewed from a thickness direction (for example, DR4) of the display device, the non-display area NDA, for example, may surround or otherwise be adjacent to the display area DA. For example, the non-display area NDA may be adjacent to the display area DA in a first direction DR1 and a third direction DR3. The third direction DR3 intersects the first direction DR1 and a second direction DR2.

Figure 2A:
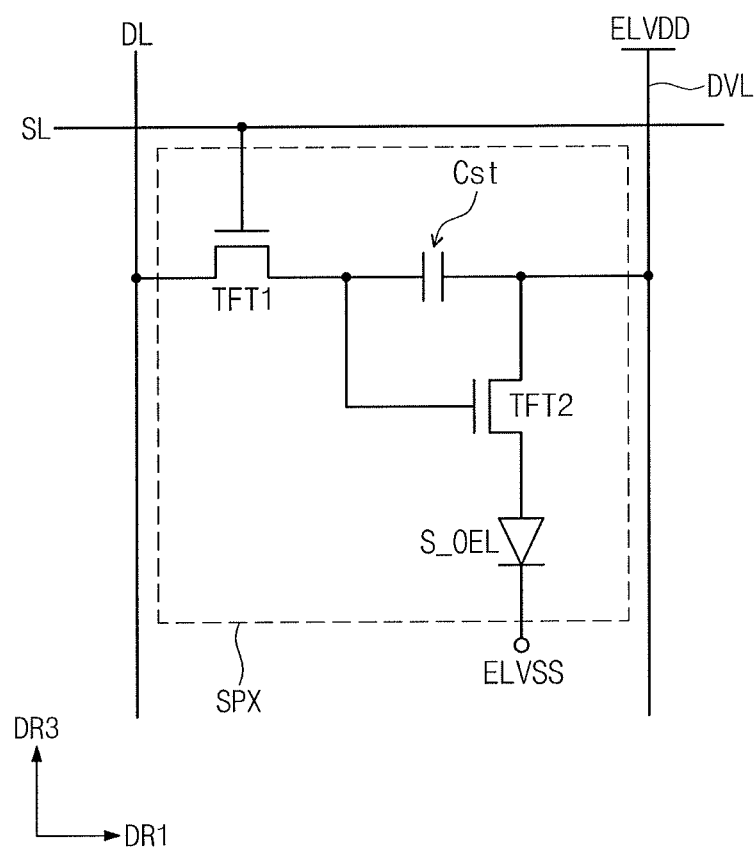
FIG. 2A illustrates an embodiment of a subpixel.
Figure 2B:
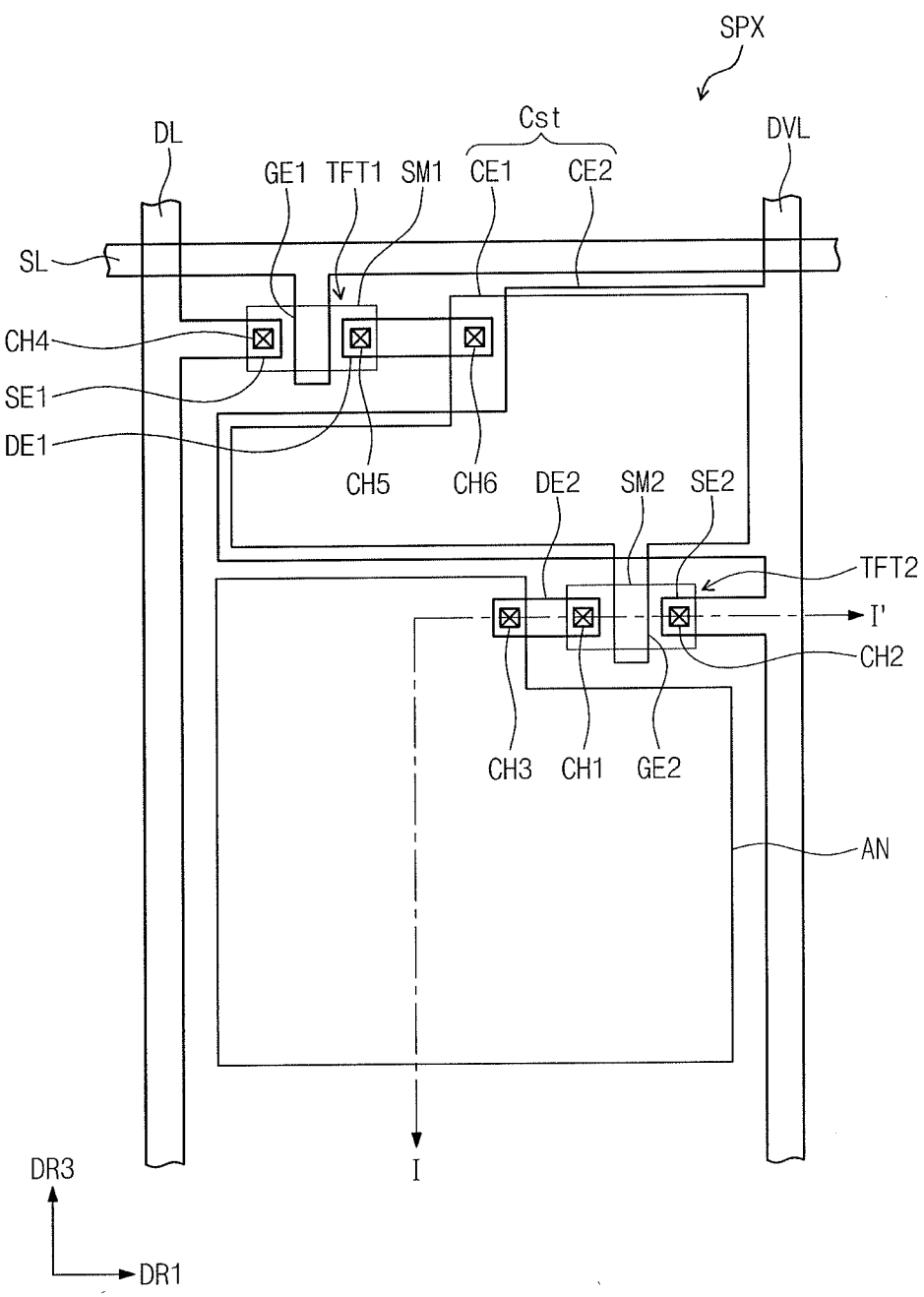
FIG. 2B illustrates a plan view of the subpixel.
Figure 2C:
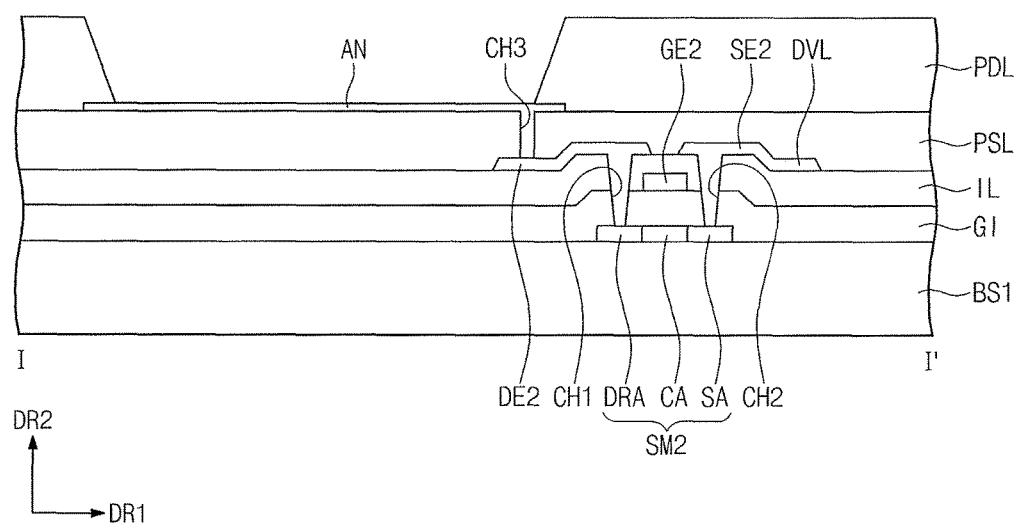
FIG. 2C illustrates a cross-sectional view along line I-I' in FIG. 2B.

FIG. 2A illustrates an embodiment of a subpixel, which is representative of the subpixels in the display device 10. FIG. 2B is a plan view illustrating the subpixel. FIG. 2C illustrates a cross-sectional view along line I-I' in FIG. 2B.

Referring to FIGS. 2A to 2C, the subpixel SPX may be connected to a conductive part including a data line DL and a drive voltage line DVL. The subpixel includes thin film transistors TFT1 and TFT2 connected to the conductive part. A sub-organic electroluminescent device S_OEL and a capacitor Cst are connected to the thin film transistors TFT1 and TFT2. The subpixel emits light of a specific color, e.g., red, green, blue, cyan, magenta, yellow, white, or another color.

A first voltage ELVDD and a second voltage ELVSS lower than the first voltage ELVDD are provided to the subpixel SPX. The first voltage ELVDD and the second voltage ELVSS are provided to the sub-organic electroluminescent device S_OEL.

A scan line SL extends in the first direction DR1. The data line DL extends in a third direction DR3 intersecting the scan line SL. A drive voltage line DVL extends in a direction substantially identical to that of the data line DL, that is, the third direction DR3. The drive voltage line DVL receives the first voltage ELVDD. The scan line SL transmits a scan signal to the thin film transistor TFT1 and TFT2. The data line DL transmits a data signal to the thin film transistor TFT1 and TFT2. The drive voltage line DVL provides a drive voltage to the thin film transistor TFT1 and TFT2. A conductive layer CL, a filling pattern FP, and the sub-organic electroluminescent device S_OEL receive the second voltage ELVSS.

The thin film transistors TFT1 and TFT2 include a driving thin film transistor TFT2 to control the sub-organic electroluminescent device S_OEL and a switching thin film transistor TFT1 to switch the driving thin film transistor TFT2. In an embodiment, the subpixel SPX includes two of the thin film transistors TFT1 and TFT2. In another embodiment, the subpixel SPX may have a different number of transistors and/or capacitors.

The switching thin film transistor TFT1 includes a first gate electrode GE1, a first source electrode SE1, and a first drain electrode DE1. The first gate electrode GE1 is connected to the scan line SL, and the first source electrode SE1 is connected to the data line DL. The first drain electrode DE1 is connected to a first common electrode CE1 through a fifth contact hole CH5. The switching thin film transistor TFT1 transmits the data signal from the data line DL to the driving thin film transistor TFT2 according to the scan signal applied to the scan line SL.

The driving thin film transistor TFT2 includes a second gate electrode GE2, a second source electrode SE2, and a second drain electrode DE2. The second gate electrode GE2 is connected to the first common electrode CE1. The second source electrode SE2 is connected to the drive voltage line DVL. The second drain electrode DE2 is connected to an anode AN through a third contact hole CH3.

The capacitor Cst is connected between the second gate electrode GE2 and the second source electrode SE2, which are in the driving thin film transistor TFT2. The capacitor Cst charges and maintains the data signal input to the second gate electrode GE2 in the driving thin film transistor TFT2. The capacitor Cst may include the first common electrode CE1 connected to the first drain electrode DE1 through a sixth contact hole CH6 and a second common electrode CE2 connected to the drive voltage line DVL.

In accordance with the present embodiment, the display device 10 includes a first substrate and a second substrate. The first substrate includes a first base substrate BS1, the thin film transistor TFT1 and TFT2, and the organic electroluminescent device (e.g., OEL in FIG. 5A). The second substrate includes a second base substrate BS2, a base layer CF1, CF2, CF3, CF4, BM, and OC, the conductive layer CL, and the filling pattern FP.

The first base substrate BS1 includes a light emitting area and a non-light emitting area. The light emitting area includes a first light emitting area (e.g., EA1 in FIG. 3A), a second light emitting area (e.g., EA2 in FIG. 3A), a third light emitting area (e.g., EA3 in FIG. 3A), and a fourth light emitting area (e.g., EA4 in FIG. 3A). The non-light emitting area includes a first non-light emitting area (e.g., NEA1 in FIG. 3A), a second non-light emitting area (e.g., NEA2 in FIG. 3A), a third non-light emitting area (e.g., NEA3 in FIG. 3A), and a fourth non-light emitting area (e.g., NEA4 in FIG. 3A).

The first base substrate may include an insulating material such as glass, plastic, or quartz. An organic polymer in the first base substrate BS1 may include polyethylene terephthalate (PET), polyethylene naphthalate (PEN), polyimide, or polyethersulfone. The first base substrate BS1 may be selected by considering mechanical strength, thermal stability, transparency, surface smoothness, ease of use, or water resistance, and the like.

A substrate buffer layer may be disposed on the first base substrate BS1. The substrate buffer layer prevents impurities from diffusing to the switching thin film transistor TFT1 and the driving thin film transistor TFT2. The substrate buffer layer may be formed, for example, of silicon nitride (SiNx), silicon oxide (SiOx), or silicon oxynitride (SiOxNy), and the like, and may also be excluded according to the material and process conditions of the first base substrate BS1.

A first semiconductor layer SM1 and a second semiconductor layer SM2 are on the first base substrate BS1. The first semiconductor layer SM1 and the second semiconductor layer SM2 include a semiconductor material and respectively act as an activation layer for the switching thin film transistor TFT1 and the driving thin film transistor TFT2. Each of the first semiconductor layer SM1 and the second semiconductor layer SM2 includes a channel area CA between a source area SA and a drain area DRA. Each of the first semiconductor layer SM1 and the second semiconductor layer SM2 may include an inorganic semiconductor material and/or an organic semiconductor material. The source area SA and the drain area DRA may be doped with n-type or p-type impurities.

A gate insulating layer GI may be on the first semiconductor layer SM1 and the second semiconductor layer SM2.

The gate insulating layer G1 covers the first semiconductor layer SM1 and the second semiconductor layer SM2. The gate insulating layer GI may include an organic insulating material or an inorganic insulating material.

The first gate electrode GE1 and the second gate electrode GE2 are on the gate insulating layer G1. The first gate electrode GE1 and the second gate electrode GE2 are formed to cover areas corresponding to the channel area CA in the first semiconductor layer SM1 and the second semiconductor layer SM2, respectively.

An interlayer insulating layer IL is on the first gate electrode GE1 and the second gate electrode GE2. The interlayer insulating layer IL covers the first gate electrode GE1 and the second gate electrode GE2. The interlayer insulating layer IL may include an organic insulating material or an inorganic insulating material.

The first source electrode SE1, the first drain electrode DE1, the second source electrode SE2, and the second drain electrode DE2 are on the interlayer insulating layer IL. The second drain electrode DE2 is connected to the drain area DRA in the second semiconductor layer SM2 through a first contact hole CH1 in the gate insulating layer GI and the interlayer insulating layer IL. The second source electrode SE2 is connected to the source area SA in the second semiconductor layer SM2 through a second contact hole CH2 in the gate insulating layer GI and the interlayer insulating layer IL. The first source electrode SE1 is connected to the source area in the first semiconductor layer SM1 through a fourth contact hole CH4 in the gate insulating layer GI and the interlayer insulating layer IL. The first drain electrode DE1 is connected to the drain area in the first semiconductor layer SM1 through the fifth contact hole CH5 in the gate insulating layer GI and the interlayer insulating layer IL.

A passivation layer PSL is on the first source electrode SE1 and first drain electrode DE1 and on the second source electrode SE2 and second drain electrode DE2. The passivation layer PSL may serve as a protective film to protect the switching thin film transistor TFT1 and the driving thin film transistor TFT2. The passivation layer PSO may also serve as an overcoat film for flattening the top surface thereof.

The anode AN may be on the passivation layer PSL and may be, for example, a positive electrode. The anode AN is connected to the second drain electrode DE2 in the driving thin film transistor TFT2 through the third contact hole CH3 in the passivation layer PSL.

Figure 3A:
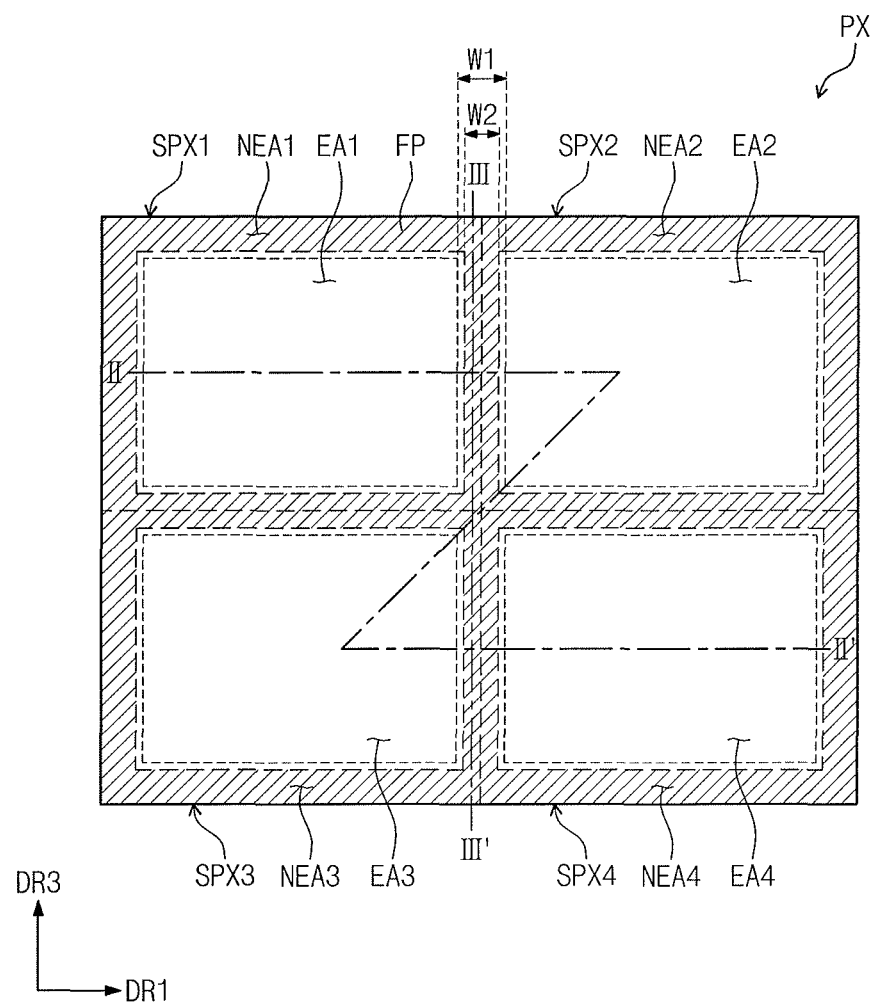
FIG. 3A illustrates an embodiment which includes pixels, a filling pattern, and a conductive layer in a display device.
Figure 3B:
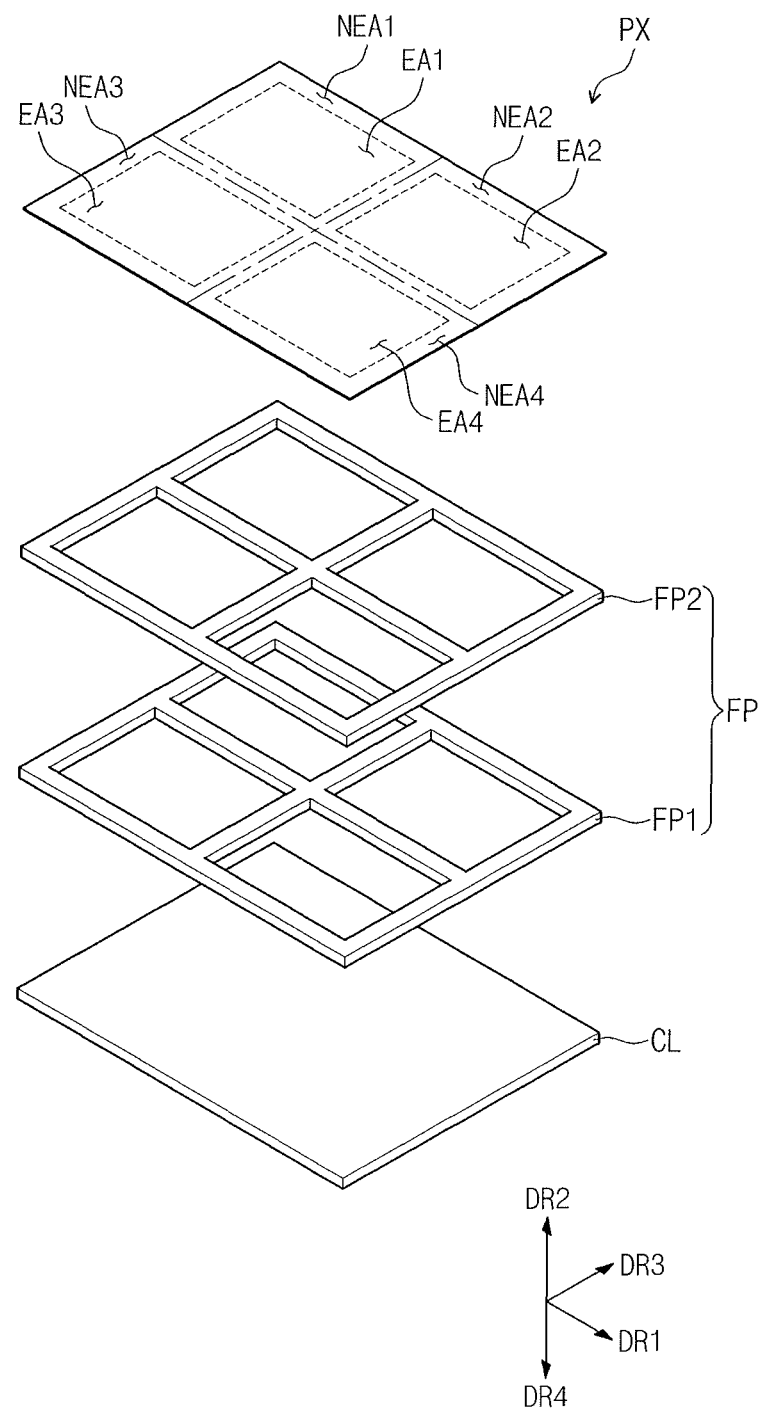
FIG. 3B illustrates a perspective view corresponding to the embodiment in FIG. 3A.

FIG. 3A illustrating a plurality of pixels PX, the filling pattern, and the conductive layer in the display device. FIG. 3B is an exploded perspective view corresponding to FIG. 3A.

Referring to FIG. 1, FIGS. 2A to 2C, and FIGS. 3A and 3B, each pixel PX includes a plurality of subpixels, e.g., a first subpixel SPX1, a second subpixel SPX2, a third subpixel SPX3, and a fourth subpixel SPX4. Each subpixel SPX includes the light emitting area and the non-light emitting area. FIGS. 3A and 3B are exemplarily in that, in a plane view in the first direction DR1, the first subpixel SPX1 is adjacent to the second subpixel SPX2, and the third subpixel SPX3 is adjacent to the fourth subpixel SPX4. Also, in a plane view in the third direction DR3, the first subpixel SPX1 is adjacent to the third subpixel SPX3, and the second subpixel SPX2 is adjacent to the fourth subpixel SP4. In another embodiment, the first subpixel SPX1, the second subpixel SPX2, the third subpixel SPX3, and the fourth subpixel SPX4 may be arranged in different ways.

Moreover, FIGS. 3A and 3B are exemplarily in that, in a plane view, the first subpixel SPX1, the second subpixel SPX2, the third subpixel SPX3, and the fourth subpixel SPX4 are identical in shape to each other and equal in size to each other. In another embodiment, the shape and/or size of the first subpixel SPX1, the second subpixel SPX2, the third subpixel SPX3, and the fourth subpixel SPX4 may be different.

Furthermore, FIGS. 3A and 3B are exemplarily in that each of the first subpixel SPX1, the second subpixel SPX2, the third subpixel SPX3, and the fourth subpixel SPX4 has a rectangular shape. In another embodiment, the first subpixel SPX1, the second subpixel SPX2, the third subpixel SPX3, and the fourth subpixel SPX4 may a different shape, e.g., at least one shape among a circle, an ellipse, a square, a parallelogram, a trapezoid, and a rhombus. In addition, each of the first subpixel SPX1, the second subpixel SPX2, the third subpixel SPX3, and the fourth subpixel SPX4 may, for example, have a rectangular shape in which at least one corner has a rounded shape.

Referring to FIGS. 3A and 3B, in a plane view, each of the first light emitting area EA1, the second light emitting area EA2, the third light emitting area EA3, and the fourth light emitting area EA4 may have a rectangular shape. In another embodiment, the first light emitting area EA1, the second light emitting area EA2, the third light emitting area EA3, and the fourth light emitting area EA4 may have a different shape, e.g., at least one shape among a circle, an ellipse, a square, a parallelogram, a trapezoid, and a rhombus. Moreover, in a plane view, each of the first light emitting area EA1, the second light emitting area EA2, the third light emitting area EA3, and the fourth light emitting area EA4 may, for example, have a rectangular shape in which one at least one corner has a rounded shape.

Referring to FIGS. 3A and 3B, in a plane view, the first light emitting area EA1, the second light emitting area EA2, the third light emitting area EA3, and the fourth light emitting area EA4 may be spaced apart and in sequence in the first direction DR1. In a plane view, the shape of each of the first light emitting area EA1, the second light emitting area EA2, the third light emitting area EA3, and the fourth light emitting area EA4 may be a rectangle having a length in the third direction DR3 longer than the length in the first direction DR1.

The conductive layer CL may overlap each of the light emitting area EA1, EA2, EA3, and EA4 and the non-light emitting area NEA1, NEA2, NEA3, and NEA4. For example, in a plane view, the conductive layer CL may overlap each of the light emitting area EA1, EA2, EA3, and EA4 and the non-light emitting area NEA1, NEA2, NEA3, and NEA4.

The filling pattern FP overlaps a portion of the conductive layer CL. The filling pattern FP may be spaced apart from the light emitting area EA1, EA2, EA3, and EA4 and may overlap a portion of the non-light emitting area NEA1, NEA2, NEA3, and NEA4. For example, in a plane view, the filling pattern FP may be spaced apart from the light emitting area EA1, EA2, EA3, and EA4 and overlap a portion of the non-light emitting area NEA1, NEA2, NEA3, and NEA4. In a plane view, the width W2 of the filling pattern FP may be less than the width W1 of the non-light emitting area NEA1, NEA2, NEA3, and NEA4. (The term "width" may be, for example, in the first direction).

In a plane view, the filling pattern FP may be in the form of a mesh. For example, in a plane view, the filling pattern FP may be in a form where, from a first rectangular shape, second rectangular shapes smaller than the first rectangular shape are excluded from the first rectangular shape.

The filling pattern FP includes a first filling pattern FP1 and a second filling pattern FP2. The first filling pattern FP1 may be spaced apart from the light emitting area EA1, EA2, EA3, and EA4 and may overlap a portion of the non-light emitting area NEA1, NEA2, NEA3, and NEA4. In a plane view, the width of the first filling pattern FP1 may be less than the width W1 of the non-light emitting area NEA1, NEA2, NEA3, and NEA4.

In a plane view, the first filling pattern FP1 may be in the form of a mesh. For example, in a plane view, the first filling pattern FP1 may be in a form where, from a first rectangular shape, second rectangular shapes smaller than the first rectangular shape are excluded from the first rectangular shape.

The second filling pattern FP2 may be spaced apart from the light emitting area EA1, EA2, EA3, and EA4 and may overlap a portion of the non-light emitting area NEA1, NEA2, NEA3, and NEA4. For example, in a plane view, the second filling pattern FP2 may be spaced apart from the light emitting area EA1, EA2, EA3, and EA4 and may overlap a portion of the non-light emitting area NEA1, NEA2, NEA3, and NEA4. In a plane view, the width of the second filling pattern FP2 may be less than the width W1 of the non-light emitting area NEA1, NEA2, NEA3, and NEA4.

In a plane view, the second filling pattern may be in the form of a mesh. For example, in a plane view, the second filling pattern FP2 may be in a form where, from a first rectangular shape, second rectangular shapes smaller than the first rectangular shape are excluded from the first rectangular shape.

In a plane view, the shape of the first filling pattern FP1 may be identical to the shape of the second filling pattern FP2. In a plane view, the size of the shape of the first filling pattern FP1 may be equal to, or differ from, the size of the shape of the second filling pattern FP2.

FIGS. 4A to 4D illustrate embodiments of the light emitting areas in the display device. In a plane view, the first light emitting area EA1, the second light emitting area EA2, the third light emitting area EA3, and the fourth light emitting area EA4 may have various predetermined shapes.

Figure 4A:
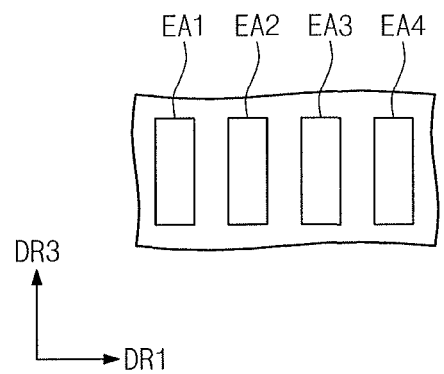
FIGS. 4A to 4D illustrate examples of light emitting areas in a display device.

Referring to FIG. 4A, in a plane view, the first light emitting area EA1, the second light emitting area EA2, the third light emitting area EA3, and the fourth light emitting area EA4 may be spaced apart, in sequence, in the first direction DR1. Also, in a plane view, the shape of each of the first light emitting area EA1, the second light emitting area EA2, the third light emitting area EA3, and the fourth light emitting area EA4 may be a rectangle having a length in the third direction DR3 longer than the length in the first direction DR1.

Figure 4B:
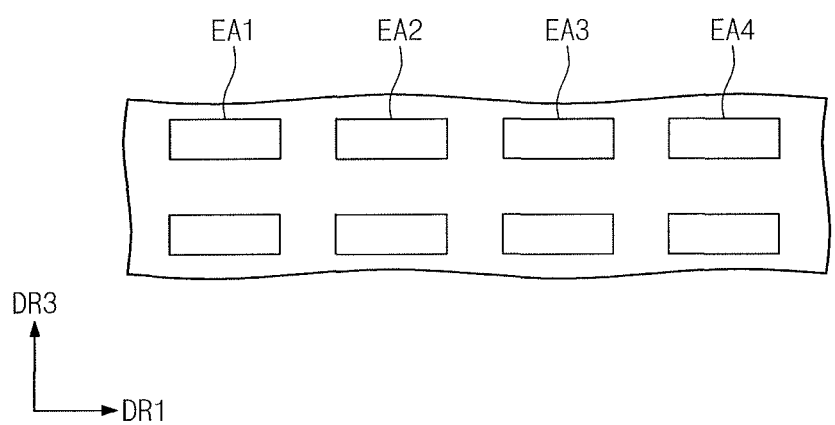

Referring to FIG. 4B, in a plane view, the first light emitting area EA1, the second light emitting area EA2, the third light emitting area EA3, and the fourth light emitting area EA4 may be spaced apart, in sequence, in the first direction DR1. Also, in a plane view, the shape of each of the first light emitting area EA1, the second light emitting area EA2, the third light emitting area EA3, and the fourth light emitting area EA4 may be a rectangle having a length in the first direction DR1 longer than the length in the third direction DR3.

Figure 4C:
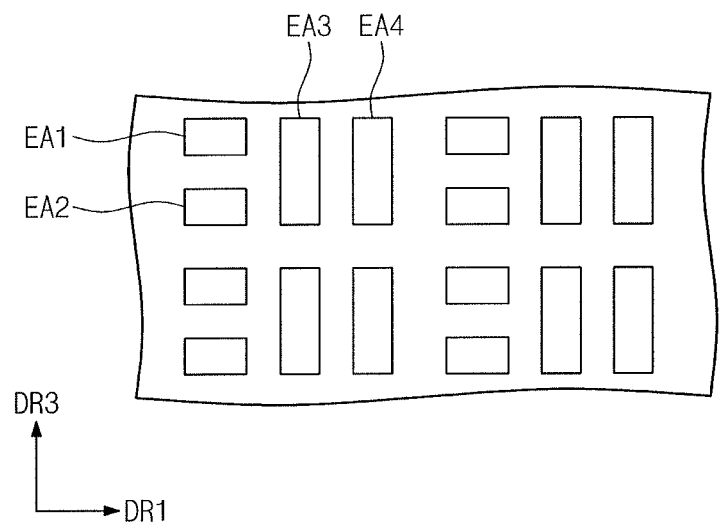

Referring to FIG. 4C, in a plane view, the first light emitting area EA1 and the second light emitting area EA2 may be spaced apart in the third direction DR3. The third light emitting area EA3 and the fourth light emitting area EA4 may be spaced apart in the first direction DR1. The shape of each of the first light emitting area EA1 and the second light emitting area EA2 may be a rectangle having a length in the first direction DR1 longer than the length in the third direction DR3. The shape of each of the third light emitting area EA3 and the fourth light emitting area EA4 may be a rectangle having a length in the third direction DR3 longer than the length in the first direction DR1.

Figure 4D:
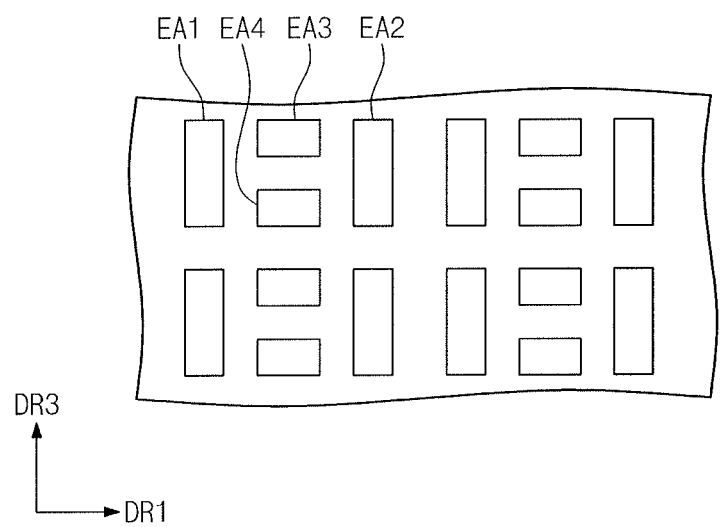

Referring to FIG. 4D, in a plane view, the first light emitting area EA1 and the second light emitting area EA2 may be spaced apart in the first direction DR1. The third light emitting area EA3 and the fourth light emitting area EA4 may be between the first light emitting area EA1 and the second light emitting area EA2. The third light emitting area EA3 and the fourth light emitting area EA4 may be spaced apart in the third direction DR3. The shape of each of the first light emitting area EA1 and the second light emitting area EA2 may be a rectangle having a length in the third direction DR3 longer than the length in the first direction DR1. The shape of each of the third light emitting area EA3 and the fourth light emitting area EA4 may be a rectangle having a length in the first direction DR1 longer than the length in the third direction DR3.

FIGS. 4A to 4D illustrate examples, in a plane view, the positional relationships between the first light emitting area EA1, the second light emitting area EA2, the third light emitting area EA3, and the fourth light emitting area EA4, and the shape of each of the first light emitting area EA1, the second light emitting area EA2, the third light emitting area EA3, and the fourth light emitting area EA4. The first light emitting area EA1, the second light emitting area EA2, the third light emitting area EA3, and the fourth light emitting area EA4 may be arranged in different ways in other embodiments. Also, the first light emitting area EA1, the second light emitting area EA2, the third light emitting area EA3, and the fourth light emitting area EA4 may have different shapes in other embodiments.

Figure 5A:
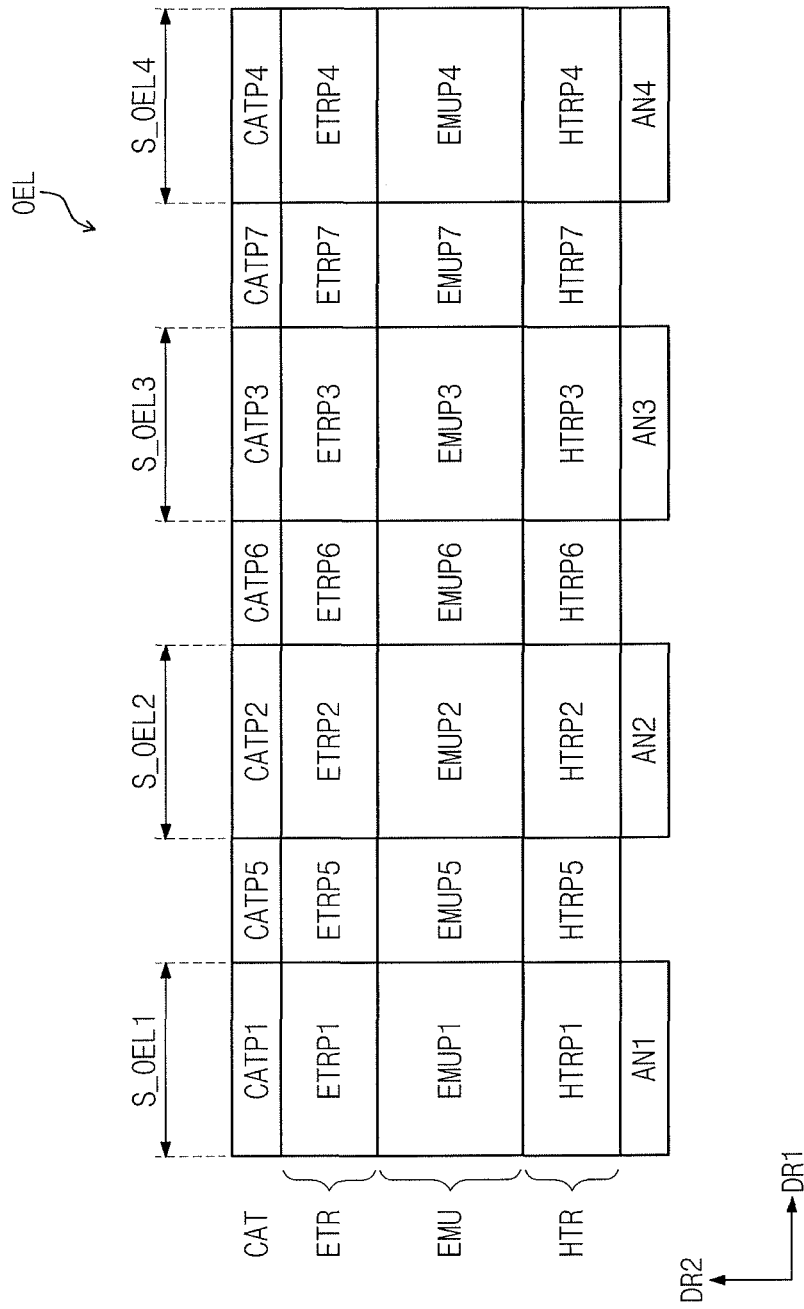
FIG. 5A illustrates an embodiment of an organic electroluminescent device.

FIG. 5A is a cross-sectional view illustrating an embodiment of the organic electroluminescent (OEL) device which may be included in one or more embodiments of the display device. The OEL may emit white light or a different color of light.

The organic electroluminescent device OEL includes a first sub-organic electroluminescent device S_OEL1, a second sub-organic electroluminescent device S_OEL2, a third sub-organic electroluminescent device S_OEL3, and a fourth sub-organic electroluminescent device S_OEL4. The first sub-organic electroluminescent device S_OEL1, the second sub-organic electroluminescent device S_OEL2, the third sub-organic electroluminescent device S_OEL3, and the fourth sub-organic electroluminescent device S_OEL4 are spaced apart from each other in cross section.

The first sub-organic electroluminescent device S_OEL1 includes a first anode AN1, a first hole transport region part HTRP1, a first light emitting unit part EMUP1, a first electron transport region part ETRP1, and a first cathode part CATP1. The first sub-organic electroluminescent device S_OEL1 may include the first light emitting area EA1 and the first non-light emitting area NEA1.

The second sub-organic electroluminescent device S_OEL2 includes a second anode AN2, a second hole transport region part HTRP2, a second light emitting unit part EMUP2, a second electron transport region part ETRP2, and a second cathode part CATP2. The second sub-organic electroluminescent device S_OEL2 may include the second light emitting area EA2 and the second non-light emitting area NEA2.

The third sub-organic electroluminescent device S_OEL3 includes a third anode AN3, a third hole transport region part HTRP3, a third light emitting unit part EMUP3, a third electron transport region part ETRP3, and a third cathode part CATP3. The third sub-organic electroluminescent device S_OEL3 may include the third light emitting area EA3 and the third non-light emitting area NEA3.

The fourth sub-organic electroluminescent device S_OEL4 includes a fourth anode AN4, a fourth hole transport region part HTRP4, a fourth light emitting unit part EMUP4, a fourth electron transport region part ETRP4, and a fourth cathode part CATP4. The fourth sub-organic electroluminescent device S_OEL4 may include the fourth light emitting area EA4 and the fourth non-light emitting area NEA4.

Figure 5B:
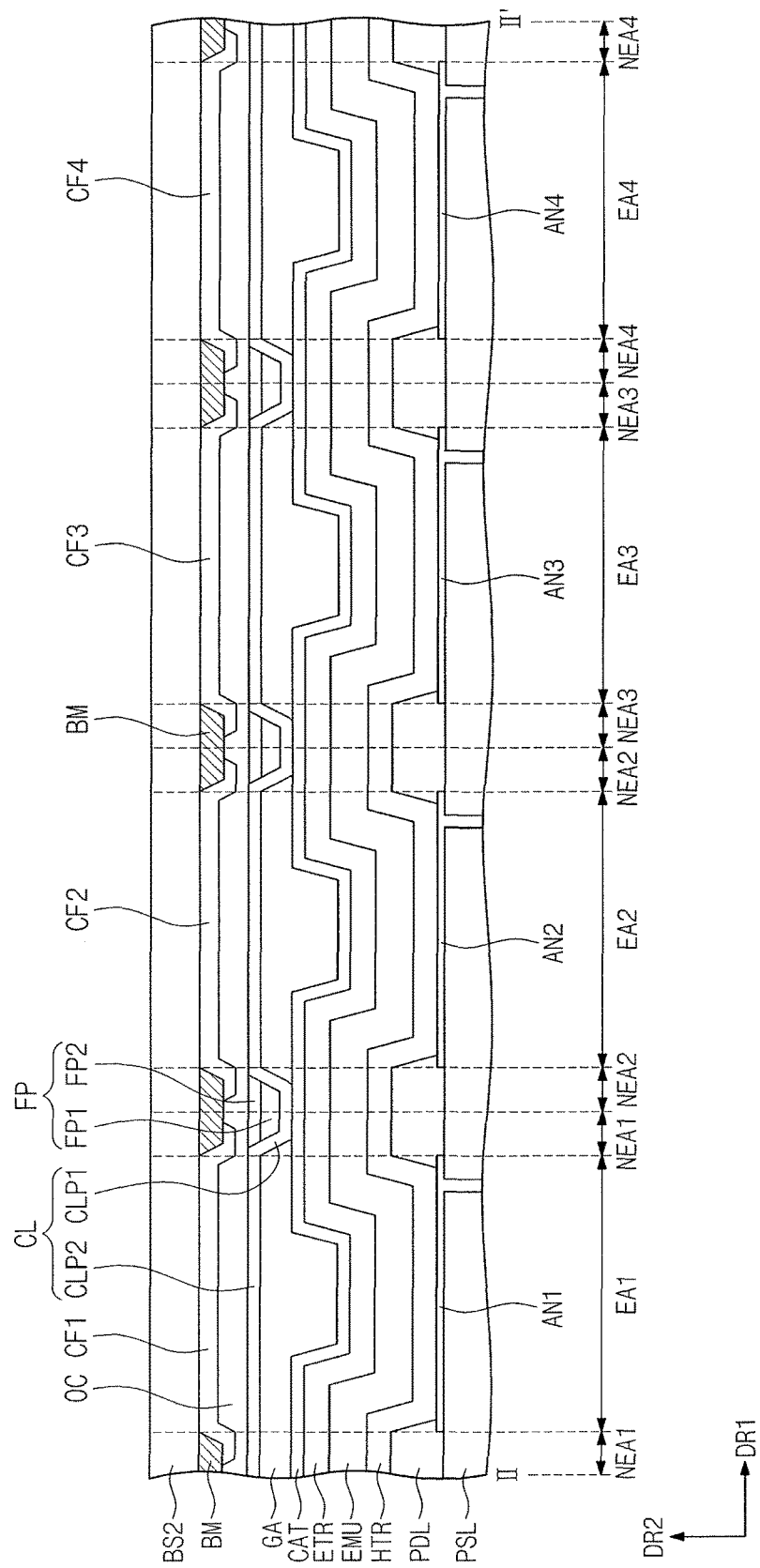
FIG. 5B illustrates a cross-sectional view along line II-II' in FIG. 3A.
Figure 5C:
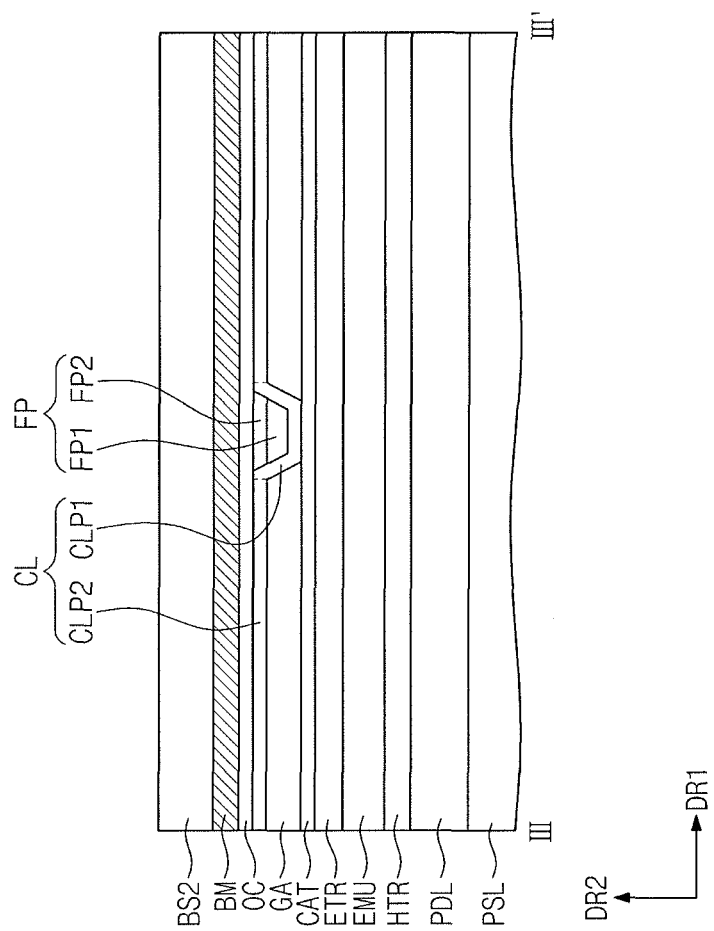
FIG. 5C illustrates a cross-sectional view along line in FIG. 3A.

FIG. 5B is cross-sectional view along line II-II' in FIG. 3A, and FIG. 5C is a cross-sectional view along line in FIG. 3A.

Referring to FIG. 1, FIGS. 2A to 2C, FIGS. 3A and 3B, and FIGS. 5A to 5C, the first anode AN1, the second anode AN2, the third anode AN3, and the fourth anode AN4 are spaced apart from each other in cross section. The first anode AN1, the second anode AN2, the third anode AN3, and the fourth anode AN4 are spaced apart from each. The first anode AN1, the second anode AN2, the third anode AN3, and the fourth anode AN4 may be reflective electrodes. When each of the first anode AN1, the second anode AN2, the third anode AN3, and the fourth anode AN4 is a reflective electrode, each of the first anode AN1, the second anode AN2, the third anode AN3, and the fourth anode AN4 may include, for example, silver (Ag), magnesium (Mg), aluminum (Al), platinum (Pt), palladium (Pd), gold (Au), nickel (Ni), neodymium (Nd), iridium (Ir), chrome (Cr), or a combination of metals.

A hole transport region HTR is on the first anode AN1, the second anode AN2, the third anode AN3, and the fourth anode AN4. The hole transport region may be a single body (e.g., with a unitary integral construction) disposed in, for example, the first light emitting area EA1, the first non-light emitting area NEA1, the second light emitting area EA2, the second non-light emitting area NEA2, the third light emitting area EA3, the third non-light emitting area NEA3, the fourth light emitting area EA4, and the fourth non-light emitting area NEA4.

The hole transport region HTR includes a hole injection layer and a hole transport layer. The hole injection layer and the hole transport layer may be formed as a single layer. The hole injection layer and the hole transport layer may be formed as a single layer and may include a dopant, e.g., a p-type dopant. The hole transport region HTR may further include at least one of a hole buffer layer or a hole blocking layer.

The hole injection layer may include, for example, a phthalocyanine compound such as copper phthalocyanine, or n,n'-diphenyl-n,n'-bis-[4-(phenyl-m-tolyl-amino)-phenyl]-biphenyl-4,4'-diamine (DNTPD), 4,4',4"-tris(3-methylphenylphenylamino (m-MTDATA), 4,4'4"-tris(n,n-diphenylamino)triphenylamine (TDATA), 4,4',4"-tris{n,-(2-naphthyl)-n-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), or (polyaniline)/poly(4-styrenesulfonate) (PANI/PSS), and the like.

The hole injection layer may further include a charge generating material in order to improve conductivity. The charge generating material may be uniformly or non-uniformly distributed in the hole injection layer. The charge generating material may be, for example, a p-type dopant. At least a portion of the hole injection layer may include the p-type dopant. The p-type dopant may include, for example, one of a quinone derivative, a metal oxide, or a cyano group-containing compound. For example, a non-limiting example of the p-type dopant may include a quinone derivative such as tetracyanoquinodimethane (TCNQ) or 2,3,5,6-tetrafluoro-tetracyanoquinodimethane (F4-TCNQ), or a metal oxide such as tungsten oxide or molybdenum oxide.

The hole transport layer is on the hole injection layer. The hole transport layer may include, for example, a carbazole-based derivative such as n-phenylcarbazole or polyvinylcarbazole, a fluorine-based derivative, a triphenylamine-based derivative such as n,n'-bis(3-methylphenyl)-n,n'-diphenyl-[1,1-biphenyl]-4,4'-diamine (TPD) or 4,4',4"-tris(n-carbazolyl)triphenylamine (TCTA), n,n'-di(1-naphthyl)-n,n'-diphenylbenzidine (NPB), or 4,4'-cyclohexylidene bis[n,n-bis(4-methylphenyl)benzenamine] (TAPC), and the like, but is not limited thereto.

The hole transport region HTR includes the first hole transport region part HTRP1, the second hole transport region part HTRP2, the third hole transport region part HTRP3, the fourth hole transport region part HTRP4, a fifth hole transport region part HTRP5, a sixth hole transport region part HTRP6, and a seventh hole transport region part HTRP7. The first hole transport region part HTRP1, the fifth hole transport region part HTRP5, the second hole transport region part HTRP2, the sixth hole transport region part HTRP6, the third hole transport region part HTRP3, the seventh hole transport region part HTRP7, and the fourth hole transport region part HTRP4 are, for example, connected in sequence as a single body.

The first hole transport region part HTRP1 is in the first sub-organic electroluminescent device S_OEL1. The first hole transport region part HTRP1 overlaps the first anode AN1. The second hole transport region part HTRP2 is in the second sub-organic electroluminescent device S_OEL2. The second hole transport region part HTRP2 overlaps the second anode AN2. The third hole transport region part HTRP3 is in the third sub-organic electroluminescent device S_OEL3. The third hole transport region part HTRP3 overlaps the third anode AN3. The fourth hole transport region part HTRP4 is in the fourth sub-organic electroluminescent device S_OEL4. The fourth hole transport region part HTRP4 overlaps the fourth anode AN4. The fifth hole transport region part HTRP5 is disposed between the first hole transport region part HTRP1 and the second hole transport region part HTRP2. The sixth hole transport region part HTRP6 is between the second hole transport region part HTRP2 and the third hole transport region part HTRP3. The seventh hole transport region part HTRP7 is between the third hole transport region part HTRP3 and fourth hole transport region part HTRP4.

The light emitting unit is on the hole transport region HTR. The light emitting unit may be provided as a single body disposed in, for example, the first light emitting area EA1, the first non-light emitting area NEA1, the second light emitting area EA2, the second non-light emitting area NEA2, the third light emitting area EA3, the third non-light emitting area NEA3, the fourth light emitting area EA4, and the fourth non-light emitting area NEA4. The light emitting unit may emit, for example, white light.

The light emitting unit EMU includes the first light emitting unit part EMUP1, the second light emitting unit part EMUP2, the third light emitting unit part EMUP3, the fourth light emitting unit part EMUP4, a fifth light emitting unit part EMUP5, a sixth light emitting unit part EMUP6, and a seventh light emitting unit part EMUP7. The first light emitting unit part EMUP1, the fifth light emitting unit part EMUP5, the second light emitting unit part EMUP2, the sixth light emitting unit part EMUP6, the third light emitting unit part EMUP3, the seventh light emitting unit part EMUP7, and the fourth light emitting unit part EMUP4 are, for example, connected in sequence as a single body.

Figure 6A:
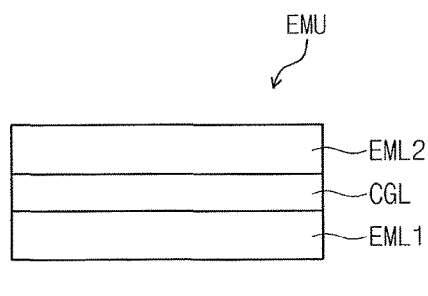
FIGS. 6A to 6D illustrate an embodiment of a light emitting unit.

FIGS. 6A to 6D are cross-sectional views illustrating embodiments of the light emitting unit in the display device. Referring to FIG. 6A, the light emitting unit EMU may include a first light emitting layer EML1, a charge generating layer CGL, and a second light emitting layer EML2 that are laminated in sequence. The first light emitting layer EML1 and the second light emitting layer EML2 may emit light having a different color from each other. For example, the first light emitting layer EML1 may emit yellow light, and the second light emitting layer EML2 may emit blue light. In another embodiment, the first light emitting layer EML1 may emit blue light and the second light emitting layer EML2 may emit yellow light.

The charge generating layer CGL is between the first light emitting layer EML1 and the second light emitting layer EML2 to regulate the charge uniformity between the first light emitting layer EML1 and the second light emitting layer EML2. The charge generating layer CGL may include an interconnecting metal layer to facilitate injection of electrons into the first light emitting layer EML1, and an interconnecting hole injection layer to facilitate injection of holes into the second light emitting layer EML2.

For example, the interconnecting metal layer may be formed of an organic material layer doped with an alkali metal having excellent electron injection properties. The interconnecting hole injection layer may e formed of an organic semiconductor layer that includes a p-type organic material. In another embodiment, the charge generating layer CGL may be formed as a single layer.

Figure 6B:
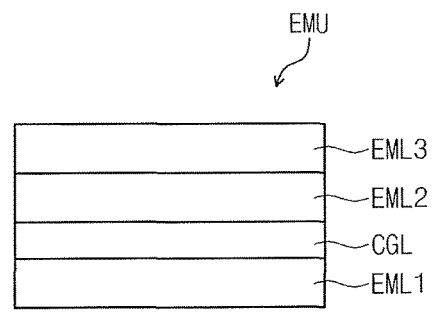

Referring to FIG. 6B, the light emitting unit EMU may include the first light emitting layer EML1, the charge generating layer CGL, the second light emitting layer EML2, and a third light emitting layer EML3 that are laminated in sequence. Each of the first light emitting layer EML1, the second light emitting layer EML2, and the third light emitting layer EML3 may emit light of a different color. For example, the first light emitting layer EML1 may emit yellow light, the second light emitting layer EML2 may emit green light, and the third light emitting layer EML3 may emit red light. In another embodiment, the first light emitting layer EML1 may emit yellow light, the second light emitting layer EML2 may emit red light, and the third light emitting layer EML3 may emit green light. The charge generating layer CGL is between the first light emitting layer EML1 and the second light emitting layer EML2 to regulate the charge uniformity between the first light emitting layer EML1 and the second and third light emitting layers EML2 and EML3.

Figure 6C:
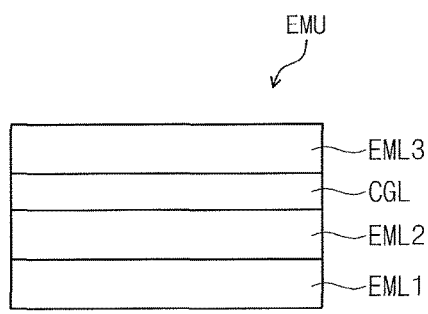

Referring to FIG. 6C, the light emitting unit EMU may include the first light emitting layer EML1, the second light emitting layer EML2, the charge generating layer CGL, and the third light emitting layer EML3 that are laminated in sequence. Each of the first light emitting layer EML1, the second light emitting layer EML2, and the third light emitting layer EML3 may emit light of a different color. For example, the first light emitting layer EML1 may emit red light, the second light emitting layer EML2 may emit green light, and the third light emitting layer EML3 may emit yellow light. In another embodiment, the first light emitting layer EML1 may emit green light, the second light emitting layer EML2 may emit red light, and the third light emitting layer EML3 may emit yellow light. The charge generating layer CGL is between the second light emitting layer EML2 and the third light emitting layer EML3 and regulates the charge uniformity between the third light emitting layer EML3 and the first and second light emitting layers EML1 and EML2.

Figure 6D:
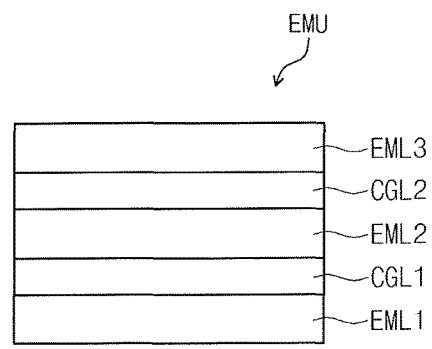

Referring to FIG. 6D, the light emitting unit EMU may include the first light emitting layer EML1, a first charge generating layer CGL1, the second light emitting layer EML2, a second charge generating layer CGL2, and the third light emitting layer EML3 that are laminated in sequence. Each of the first light emitting layer EML1, the second light emitting layer EML2, and the third light emitting layer EML3 may emit light of a different color. For example, one of the layers among the first light emitting layer EML1, the second light emitting layer EML2, and the third light emitting layer EML3 may emit blue light, one of the remaining may emit green light, and the other one may emit red light. The first charge generating layer CGL1 is between the first light emitting layer EML1 and the second light emitting layer EML2 and regulates the charge uniformity between the first light emitting layer EML1 and the second light emitting layer EML2. The second charge generating layer CGL2 is between the second light emitting layer EML2 and the third light emitting layer EML3 and regulates the charge uniformity between the second light emitting layer EML2 and the third light emitting layer EML3.

Referring to FIG. 1, FIGS. 2A to 2C, FIGS. 3A and 3B, and FIGS. 5A to 5C, the electron transport region ETR is on the light emitting unit EMU. The electron transport region ETR may be provided as a single body in, for example, the first light emitting area EA1, the first non-light emitting area NEA1, the second light emitting area EA2, the second non-light emitting area NEA2, the third light emitting area EA3, the third non-light emitting area NEA3, the fourth light emitting area EA4, and the fourth non-light emitting area NEA4. The electron transport region ETR may further include an electron transport layer. An electron injection layer is on the electron transport layer. In one embodiment, the electron injection layer may be excluded.

The electron transport layer may include, for example, tris(8-hydroxyquinolinato)aluminum (Alq3), 1,3,5-tri(1-phenyl-1h-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4h-1,2,4-triazole (NTAZ), 2-(4-biphenylyl)-5-(4-tert-butylphenyl)-1,3,4-oxadiazole (tBu-PBD), bis(2-methyl-8-quinolinolato-n1,o8)-(1,1'-biphenyl-4-olato)aluminum (BAlq), berylliumbis(benzoquinolin-10-olate) (Bebq2), 9,10-di(naphthalene-2-yl)anthracene (ADN), or derivatives thereof, but is not limited thereto. The thickness of the electron transport layer may be about 100 Å to about 1000 Å, for example about 150 Å to about 500 Å. When the thickness of the electron transport layer satisfies such a range, a satisfactory level of the electron transporting property may be realized without a substantial increase in the drive voltage.

The electron injection layer may include, for example, lithium fluoride (LiF), lithium quinolate (LiQ), lithium oxide ($Li_2O$), sodium chloride (NaCl), cesium fluoride (CsF), a lanthanide metal such as ytterbium (Yb), or a metal halide such as rubidium chloride (RbCl) or rubidium iodide (RbI). The electron injection layer may include a material in which an electron transport material is mixed with an insulating organo metal salt. The organo metal salt may be a material having an energy band gap larger than about 4 eV. For example, the organo metal salt may include metal acetate, metal benzoate, metal acetoacetate, metal acetylacetonate, or metal stearate. The thickness of the electron injection layer may be about 1 Å to about 100 Å, or about 3 Å to about 90 Å. When the thickness of the electron injection layer satisfies such a range, a satisfactory level of the electron injecting property may be realized without a substantial increase in the drive voltage.

The electron transport region ETR includes the first electron transport region part ETRP1, the second electron transport region part ETRP2, the third electron transport region part ETRP3, the fourth electron transport region part ETRP4, a fifth electron transport region part ETRP5, a sixth electron transport region part ETRP6, and a seventh electron transport region part ETRP7. The first electron transport region part ETRP1, the fifth electron transport region part ETRP5, the second electron transport region part ETRP2, the sixth electron transport region part ETRP6, the third electron transport region part ETRP3, the seventh electron transport region part ETRP7, and the fourth electron transport region part ETRP4 are, for example, connected in sequence as a single body.

The first electron transport region part ETRP1 is in the first sub-organic electroluminescent device S_OEL1. The first electron transport region part ETRP1 overlaps the first anode AN1, the first hole transport region part HTRP1, and the first light emitting unit part EMUP1. The second electron transport region part ETRP2 is in the second sub-organic electroluminescent device S_OEL2. The second electron transport region part ETRP2 overlaps the second anode AN2, the second hole transport region part HTRP2, and the second light emitting unit part EMUP2. The third electron transport region part ETRP3 is in the third sub-organic electroluminescent device S_OEL3. The third electron transport region part ETRP3 overlaps the third anode AN3, the third hole transport region part HTRP3, and the third light emitting unit part EMUP3. The fourth electron transport region part ETRP4 is in the fourth sub-organic electroluminescent device S_OEL4. The fourth electron transport region part ETRP4 overlaps the fourth anode AN4, the fourth hole transport region part HTRP4, and the fourth light emitting unit part EMUP4.

A cathode CAT is on the electron transport region ETR. The cathode may be provided as a single body in, for example, the first light emitting area EA1, the first non-light emitting area NEA1, the second light emitting area EA2, the second non-light emitting area NEA2, the third light emitting area EA3, the third non-light emitting area NEA3, the fourth light emitting area EA4, and the fourth non-light emitting area NEA4.

The cathode CAT may be a common electrode or a negative electrode. The cathode CAT may be a semi-transmissive electrode or a reflective electrode. When the cathode CAT is a semi-transmissive electrode or a reflective electrode, the cathode CAT may include, for example, silver (Ag), magnesium (Mg), copper (Cu), aluminum (Al), platinum (Pt), palladium (Pd), gold (Au), nickel (Ni), neodymium (Nd), iridium (Ir), chrome (Cr), lithium (Li), calcium (Ca), lithium fluoride/calcium (LiF/Ca), lithium fluoride/aluminum (LiF/Al), molybdenum (Mo), titanium (Ti), or compounds or mixtures thereof (for example, a mixture of Ag and Mg).

Moreover, the cathode CAT may be a multilayered structure including a reflective film or a semi-transmissive film formed of the above such materials, or a transparent conductive film formed of indium tin oxide (ITO), indium zinc oxide (IZO), zinc oxide (ZnO), or indium tin zinc oxide (ITZO), and the like.

The cathode EL2 may be connected to an auxiliary electrode. In order to face toward the light emitting unit, the auxiliary electrode may include a film formed through deposition of, for example, silver (Ag), magnesium (Mg), copper (Cu), aluminum (Al), platinum (Pt), palladium (Pd), gold (Au), nickel (Ni), neodymium (Nd), iridium (Ir), chrome (Cr), lithium (Li), calcium (Ca), lithium fluoride/calcium (LiF/Ca), lithium fluoride/aluminum (LiF/Al), molybdenum (Mo), titanium (Ti), or compounds or mixtures thereof. The cathode EL2 may include a transparent metal oxide, e.g., indium tin oxide (ITO), indium zinc oxide (IZO), zinc oxide (ZnO), indium tin zinc oxide (ITZO), molybdenum (Mo), or titanium (Ti), and the like, disposed on the film.

The organic electroluminescent device OEL may be a front surface light emitting type. The front surface light emitting type may indicate that an image is emitted from the first base substrate BS1 toward the second base substrate BS2. When the organic electroluminescent device OEL is the front surface light emitting type, the first anode AN1, the second anode AN2, the third anode AN3, and the fourth anode AN4 may be reflective electrodes, and the cathode CAT may be a transmissive or semi-transmissive electrode.

The cathode CAT includes the first cathode part CATP1, the second cathode part CATP2, the third cathode part CATP3, the fourth cathode part CATP4, a fifth cathode part CATP5, a sixth cathode part CATP6, and a seventh cathode part CATP7. The first cathode part CATP1, the fifth cathode part CATP5, the second cathode part CATP2, the sixth cathode part CATP6, the third cathode part CATP3, the seventh cathode part CATP7, and the fourth cathode part CATP4 are, for example, connected in sequence as a single body.

In the organic electroluminescent device OEL, when a voltage is applied to each of the first anode AN1, the second anode AN2, the third anode AN3, and the fourth anode AN4, and the cathode CAT, holes injected from the first anode AN1, the second anode AN2, the third anode AN3, and the fourth anode AN4 passes through the hole transport region HTR and move to the light emitting unit EMU. Electrons injected from the cathode CAT pass through the electron transport region ETR and move to the light emitting unit EMU. The electrons and holes recombine in the light emitting unit EMU to generate excitons. Light is emitted when the excitons fall from an excited state to ground state.

An organic capping layer may be disposed on the cathode CAT. The organic capping layer may be provided as a single body in, for example, the first light emitting area EA1, the first non-light emitting area NEA1, the second light emitting area EA2, the second non-light emitting area NEA2, the third light emitting area EA3, the third non-light emitting area NEA3, the fourth light emitting area EA4, and the fourth non-light emitting area NEA4.

The organic capping layer may reflect, from the top surface of the organic capping layer toward the light emitting unit EMU, light emitted from the light emitting unit EMU. The reflected light is amplified by a resonance effect in the organic layer. Thus, the luminous efficiency of the display device 10 may be increased. In the front surface light emitting type organic electroluminescent device, the organic capping layer may prevent loss of light in the cathode CAT through total internal reflection of the light.

The organic capping layer may include, for example, at least one of n4,n4,n4',n4'-tetra (biphenyl-4-yl) biphenyl-4,4'-diamine (TPD15), 4,4',4"-tris (carbazol sol-9-yl) triphenylamine (TCTA), n, n'-bis (naphthalen-1-yl), or n, n'-bis (phenyl)-2,2'-dimethylbenzidine (α-NPD).

A packaging layer may be provided on the cathode CAT and may be a single body in, for example, the first light emitting area EA1, the first non-light emitting area NEA1, the second light emitting area EA2, the second non-light emitting area NEA2, the third light emitting area EA3, the third non-light emitting area NEA3, the fourth light emitting area EA4, and the fourth non-light emitting area NEA4.

The packaging layer may cover the cathode CAT and may include at least one layer of a hybrid layer that includes all of an organic layer, an inorganic layer, an organic material, or an inorganic material. The packaging layer may be a single layer or a plurality of layers. The packaging layer may be, for example, a thin film packaging layer. The packaging layer may serve to protect organic electroluminescent device OEL.

The second base substrate BS2 is on the organic electroluminescent device OEL. The second base substrate BS2 includes the light emitting area EA1, EA2, EA3, and EA4 and the non-light emitting area NEA1, NEA2, NEA3, and NEA4. The light emitting area EA1, EA2, EA3, and EA4 includes the first light emitting area EA1, the second light emitting area EA2, the third light emitting area EA3, and the fourth light emitting area EA4. The non-light emitting area NEA1, NEA2, NEA3, and NEA4 includes the first non-light emitting area NEA1, the second non-light emitting area NEA2, the third non-light emitting area NEA3, and fourth non-light emitting area NEA4.

The typical second base substrate BS2 may include, for example, of an insulating material such as glass, plastic, or quartz. An organic polymer in the second base substrate BS2 may include, for example, polyethylene terephthalate (PET), polyethylene naphthalate (PEN), polyimide, or polyethersulfone. The second base substrate BS1 may be selected by considering, for example, mechanical strength, thermal stability, transparency, surface smoothness, ease of use, or water resistance, and the like.

The conductive layer CL, the filling pattern FP, and the base layer are between the organic electroluminescent device OEL and the second base substrate BS2. The base layer contacts the bottom surface of the base substrate BS2 and may include at least one of a color filter layer CF1, CF2, CF3, CF4, and BM or an overcoat layer OC. The color filter layer includes a color filter CF1, CF2, CF3, and CF4 and a black matrix BM.

The conductive layer CL may be completely disposed between the first base substrate BS1 and the second base substrate BS2. The conductive layer CL contacts the bottom surface of the base layer CF1, CF2, CF3, CF4, BM, and OC. The conductive layer CL is connected to the organic electroluminescent device OEL. For example, the conductive layer CL is connected to the cathode CAT.

The conductive layer CL may include a transparent conductive oxide. The typical conductive layer CL may include, for example, at least one of indium tin oxide (ITO), indium zinc oxide (IZO), or indium gallium zinc oxide (IGZO).

The conductive layer CL includes a first conductive part CLP1 and a second conductive part CPLP2. The first conductive part CLP1 protrudes from the base layer CF1, CF2, CF3, CF4, BM, and OM toward the first base substrate BS1 to accommodate the filling pattern FP. At least a portion of the first conductive part CLP1 contacts the organic electroluminescent device OEL. For example, at least a portion of the first conductive part CLP1 contacts the cathode CAT. In a plane view, the first conductive part CLP1 overlaps at least a portion of the black matrix BM. The second conductive part CLP2 is connected to the first conductive part CLP1. The second conductive part CLP2 is spaced apart from the organic electroluminescent device OEL.

As discussed above, the color filter layer CF1, CF2, CF3, CF4, and BM may be between the conductive layer CL and the second base substrate BS2. The color filter layer CF1, CF2, CF3, CF4, and BM includes the color filter CF1, CF2, CF3, CF4 and the black matrix BM. The color filter CF1, CF2, CF3, CF4 provides color to light received from the light emitting unit EMU. The color filter CF1, CF2, CF3, and CF4 may include a first color filter CF1, a second color filter CF2, a third color filter CF3, and a fourth color filter CF4.

The first color filter CF1 overlaps the first sub-organic electroluminescent device S_OEL1. The first color filter CF1 is in the first light emitting area EA1. The first color filter CF1 may provide, for example, a red color to the light received from the light emitting unit EMU. In one embodiment, the first color filter CF1 may provide a different color.

The second color filter CF2 overlaps the second sub-organic electroluminescent device S_OEL2. The second color filter CF2 is in the second light emitting area EA2. The second color filter CF2 may provide, for example, a green color to the light received from the light emitting unit EMU. In another embodiment, the second color filter CF2 may provide a different color.

The third color filter CF3 overlaps the third sub-organic electroluminescent device S_OEL3. The third color filter CF3 is in the third light emitting area EA3. The third color filter CF3 may provide, for example, a blue color to the light received from the light emitting unit EMU. In another embodiment, the third color filter CF3 may provide a different color.

The fourth color filter CF4 overlaps the fourth sub-organic electroluminescent device S_OEL4. The fourth color filter CF4 is in the fourth light emitting area EA4. The fourth color filter CF4 may provide, for example, a yellow color to the light received from the light emitting unit EMU. In another embodiment, the fourth color filter CF4 may provide a different color.

In FIG. 5B, the color filter was illustrated to include the first color filter CF1, the second color filter CF2, the third color filter CF3, and the fourth color filter CF4. In another embodiment, at least one of the first color filter CF1, the second color filter CF2, the third color filter CF3, or the fourth color filter CF4 may be excluded. The light emitting area EA1, EA2, EA3, and EA4 that excludes the color filter CF1, CF2, CF3, and CF4 may emit, for example, white light.

The black matrix BM absorbs light emitted from the light emitting unit EMU. The black matrix BM may overlap a light shielding area corresponding to an area including the scan line, the data line, and the thin film transistor (e.g., TFT1 and TFT2 in FIG. 2A). The black matrix BM may absorb light to thereby block leakage of light that occurs in the light shielding area.

The overcoat layer OC may be between the conductive layer CL and the color filter CF1, CF2, CF3, CF4, and BM. In one embodiment, the overcoat layer OC may be excluded. The overcoat layer OC may include at least one layer of a hybrid layer that includes all of an organic layer, an inorganic layer, an organic material, and an inorganic material. The overcoat layer OC may be a single layer or a plurality of layers.

The filling pattern FP is between the second base substrate BS2 and the conductive layer CL. The filling pattern FP includes the first filling pattern FP1 and the second filling pattern FP2. The first filling pattern FP1 contacts the conductive layer CL. For example, the top surface of the first filling pattern FP1 contacts the second filling pattern FP2, and the bottom surface and side wall of the first filling pattern FP1 contact the conductive layer CL. The first filling pattern FP1 includes an insulating material, e.g., a photoresist.

The second filling pattern FP2 is on the first filling pattern FP1 and may contact the base layer CF1, CF2, CF3, CF4, BM, and OC. For example, the top surface of the second filling pattern FP2 may contact the base layer CF1, CF2, CF3, CF4, BM, and OC. The bottom surface of the second filling pattern FP2 may contact the first filling pattern FP1. The side wall of the second filling pattern FP2 may contact conductive layer CL.

The second filling pattern FP2 includes a conductive material, for example, which has a lower electrical resistance than the resistance of the conductive layer CL. The conductive material may include at least one of a metal or a metal alloy. The conductive material may include, for example, at least one of Al, Cu, or Ag, or an alloy thereof. The resistivity of the conductive material may be, for example, about $1.0 \times 10^{-8}$ Ωm to about $30.0 \times 10^{-8}$ Ωm. The resistivity indicates the resistance value when the conductive material has a unit area of 1 m$^2$ and a unit length of 1 m.

The conductive layer CL and the filling pattern FP may maintain a cell gap. The cell gap may correspond to the distance between the first base substrate BS1 and the second base substrate BS2. For example, in one embodiment, the cell gap may correspond to the distance between the cathode CAT and the base layer CF1, CF2, CF3, CF4, BM, and OC.

A spacing part GA is between the cathode CAT and the base layer CF1, CF2, CF3, CF4, BM, and OC. The spacing part GA may be in the cell gap and, for example, may be a vacuum layer. In another embodiment, the spacing part GA may be at least one layer of a hybrid layer that includes all of an organic layer, an inorganic layer, an organic material, and an inorganic material. The spacing part GA may be transparent.

Figure 7A:
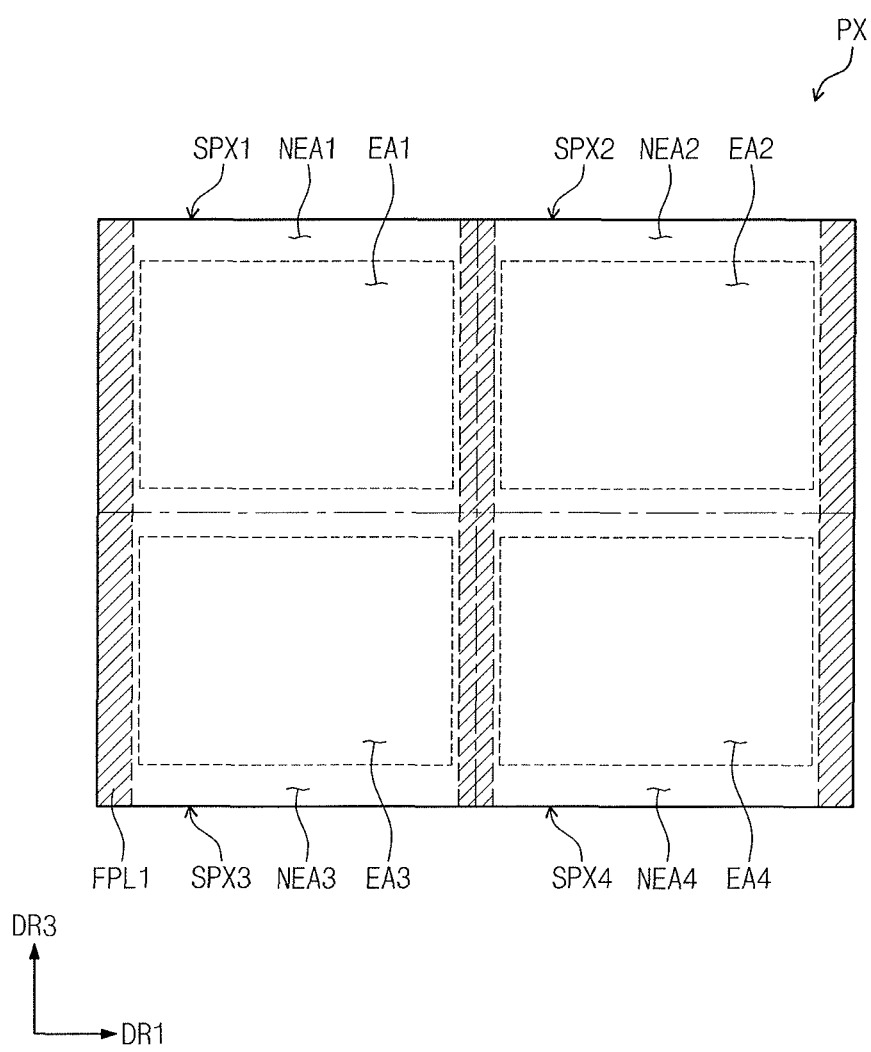

FIGS. 7A and 7B illustrate examples of the positional relationship in the filling pattern in the display device. Referring to FIG. 7A, the filling pattern FP may include first filling pattern lines FPL1 that extend in the third direction DR3 and which are spaced apart in the first direction DR1. Referring to FIG. 7B, the filling pattern FP may include second filling pattern lines FPL2 that extend in the first direction DR1 and which are spaced apart in the third direction DR3.

In FIGS. 7A and 7B, in a plane view, the first filling pattern lines FPL1 and the second filling pattern lines FPL2 are spaced apart at constant intervals. In another embodiment, in a plane view, the first filling pattern lines FPL1 and the second filling pattern lines FPL2 may be at random intervals. Moreover, FIGS. 7A and 7B, in a plane view, illustrate the positional relationship in the filling pattern FP. In another embodiment, the filling pattern may be disposed (e.g., randomly disposed) in a plane view in the non-light emitting area NEA1, NEA2, NEA3, and NEA4.

One type of display device may include a spacer for maintaining the cell gap between the first base substrate and the second base substrate. In accordance with one embodiment, instead of the separate cell gap, the display device may include the filling pattern and the conductive layer to maintain the cell gap between the first base substrate and the second base substrate. Since the display device according to at least one embodiment does not require a separate process for providing the spacer, the fabrication process may be simplified.

Moreover, in one type of front surface light emitting type display device that has been proposed, light passes from the light emitting unit through the cathode and thus may be perceived by a user. The cathode may be a conductive material that is transmissive or semi-transmissive. The transmissive or semi-transmissive material has a thin thickness. Consequently, the cathode may have an elevated resistance. Accordingly, there is a limitation in that a voltage drop (IR drop) occurs in the cathode.

In accordance with one or more embodiments, the filling pattern is connected to the conductive layer and the cathode and includes a conductive material having a lower resistance than the conductive layer. Thus, the resistance of the cathode may be reduced. As a result, any voltage drop that may occur in the cathode of the display device may be reduced or prevented. Also, the conductive layer and the filling pattern may maintain a uniform voltage distribution of the cathode, and power consumption for driving the display device may be reduced. As a result, the display device according to the present embodiment may have a high light emitting efficiency. Moreover, even when the cathode has a large area, uniform display quality may be realized over the entire surface.

Figure 8A:
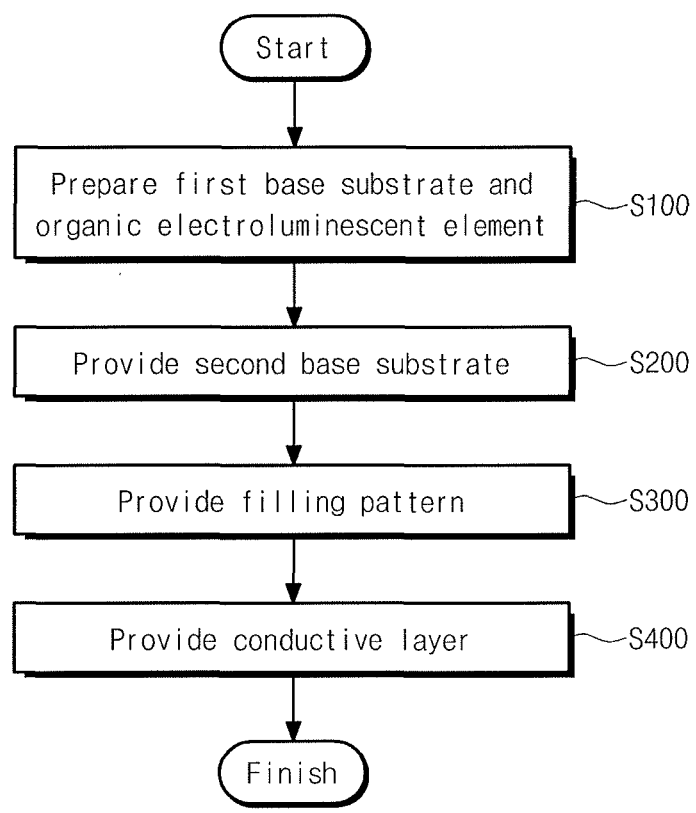
FIG. 8A illustrates an embodiment of a method for fabricating a display device.
Figure 8B:
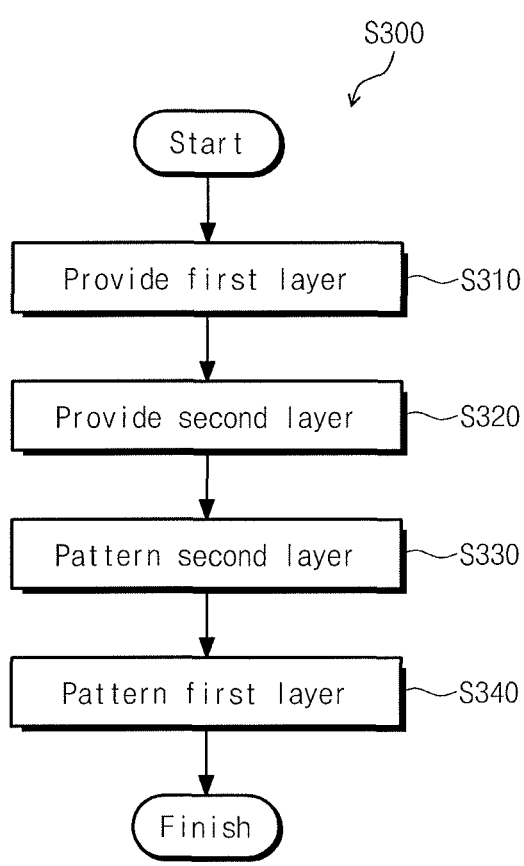
FIG. 8B illustrates additional operations of the method.

FIG. 8A illustrates an embodiment of a method for fabricating the display device. FIG. 8B illustrates additional operations of the method.

Referring to FIGS. 5A to 5C, and FIG. 8A, the method includes preparing the first base substrate BS1 and the organic electroluminescent device on the first base substrate BS1 (operation S100), preparing the second base substrate BS2 divided into the light emitting area EA1, EA2, EA3, and EA4 and the non-light emitting area NEA1, NEA2, NEA3, and NEA4 (operation S200), providing the filling pattern FP on the second substrate BS2 (operation S300), and providing the conductive layer CL on the second base substrate BS2 to cover the filling pattern FP (operation S400).

Operation S300 for providing the filling pattern FP may include providing on the second base substrate BS2 a first layer L1 that includes an insulating material (operation S310), providing a second layer L2 on the first layer L1 that includes a conductive material having a lower resistance than the resistance of the conductive layer CL (operation S320), patterning the second layer L2 (operation S3300), and patterning the first layer L1 (operation S340).

Figure 9A:
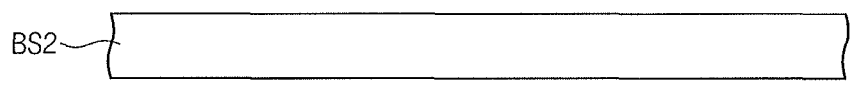
FIGS. 9A to 9H illustrate stages of fabrication corresponding to the method.
Figure 9B:
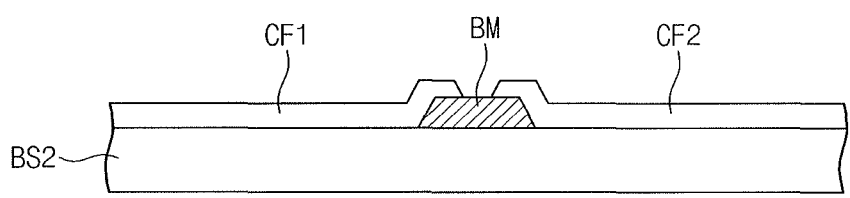

FIGS. 9A to 9H illustrate, in sequence, operations included in one embodiment of a method for fabricating a display device. Referring to FIGS. 8A, 8B, and 9A, the method includes preparing the second base substrate BS2. Referring to FIGS. 8A, 8B, and 9B, the color filter layer CF1, CF2, and BM is provided on the second base substrate BS2. The color filter CF1, CF2, and BM includes the color filter CF1 and CF2 and the black matrix BM. In FIG. 9B, for ease of description, only the first color filter CF1 and the second color filter CF2 are illustrated.

Figure 9C:
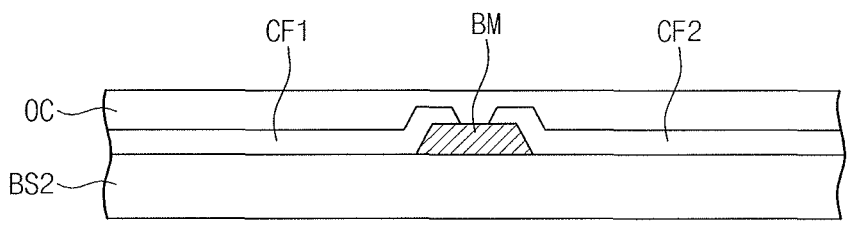

Referring to FIGS. 8A, 8B, and 9C, the overcoat layer OC is provided on the color filter layer CF1, CF2, and BM. In another embodiment, at least one operation may be excluded among the operations of providing the color filter CF1, CF2, and BM and providing the overcoat layer OC.

Figure 9D:
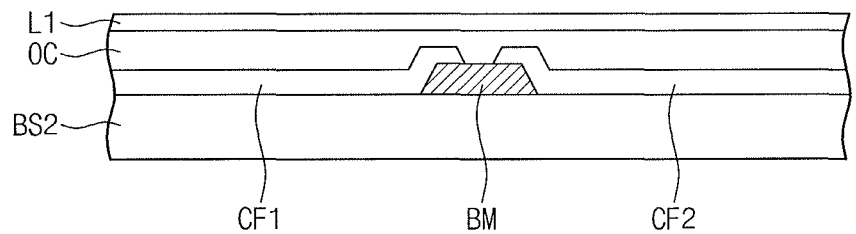

Referring to FIGS. 8A, 8B, and 9D, the first layer L1 is provided on the color filter layer CF1, CF2, and BM (S310). The operation S310 of providing the first layer L1 may be performed, for example, by applying at least one of a metal of a metal alloy.

Figure 9E:
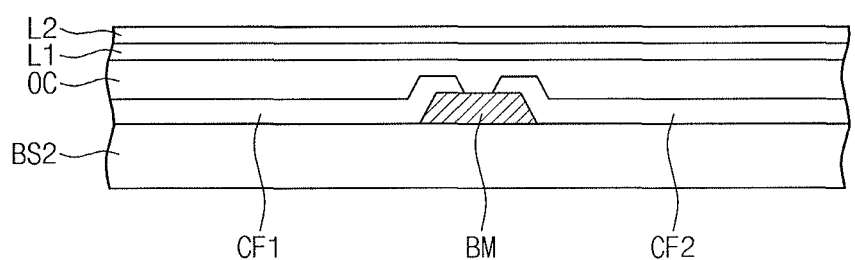
Figure 9F:
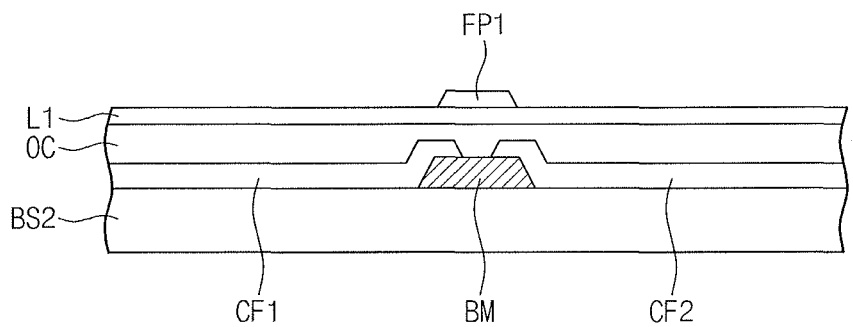
Figure 9G:
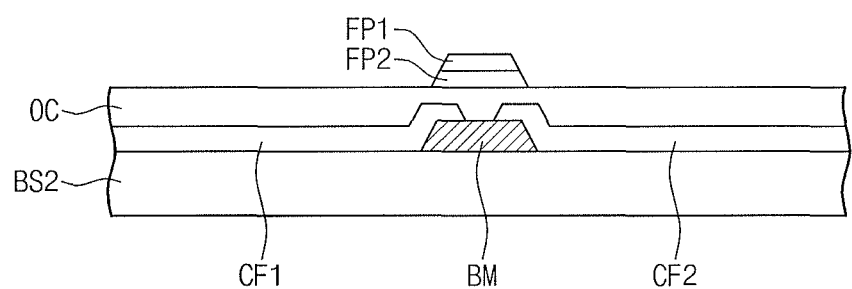
Figure 9H:
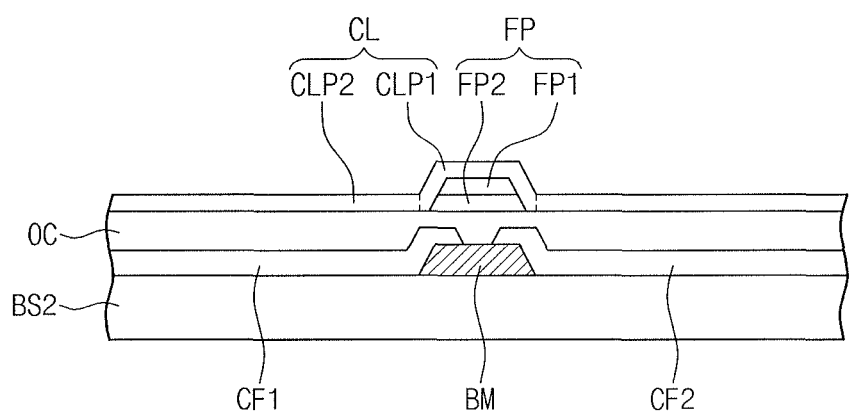

Referring to FIGS. 8A, 8B, and 9E, the second layer L2 is provided on the first layer L1 (S320). The operation of providing the second layer L2 may be performed, for example, by applying a photoresist.

Referring to FIGS. 3A, 3B, 8A, 8B, and 9F, the second layer L2 is patterned (S330). By patterning the second layer L2, the first filling pattern FP1 may be provided. The second layer L2 may be etched using, for example, a mask.

Referring to FIGS. 3A, 3B, 8A, 8B, and 9G, the first layer L1 is patterned (S340). By patterning the first layer L1, the second filling pattern FP2 may be provided. The first layer L1 may be etched using, for example, first filling pattern FP1 as a mask.

The filling pattern FP includes the first filling pattern FP1 and the second filling pattern FP2. The first filling pattern FP1 may be spaced apart from the light emitting area EA1, EA2, EA3, and EA4 and overlap a portion of the non-light emitting area NEA1, NEA2, NEA3, and NEA4. For example, in a plane view, the first filling pattern FP1 may be spaced apart from the light emitting area EA1, EA2, EA3, and EA4 and overlap a portion of the non-light emitting area NEA1, NEA2, NEA3, and NEA4. In a plane view, the width of the first filling pattern FP1 may be less than the width W1 of the non-light emitting area NEA1, NEA2, NEA3, and NEA4.

The second filling pattern FP2 may be spaced apart from the light emitting area EA1, EA2, EA3, and EA4 and overlap a portion of the non-light emitting area NEA1, NEA2, NEA3, and NEA4. For example, in a plane view, the second filling pattern FP2 may be spaced apart from the light emitting area EA1, EA2, EA3, and EA4 and overlap a portion of the non-light emitting area NEA1, NEA2, NEA3, and NEA4. In a plane view, the width of the second filling pattern FP2 may be less than the width W1 of the non-light emitting area NEA1, NEA2, NEA3, and NEA4.

Referring to FIGS. 3A, 3B, 8A, 8B, and 9H, the conductive layer CL may be provided on the filling pattern FP, that was provided by patterning each of the first layer L1 and the second layer L2 S400. In operation S400 of providing the conductive layer CL, the conductive layer CL may include a transparent conductive oxide.

The conductive layer CL may overlap each of the light emitting area EA1, EA2, EA3, and EA4 and the non-light emitting area NEA1, NEA2, NEA3, and NEA4. For example, in a plane view, the conductive layer CL may overlap each of the light emitting area EA1, EA2, EA3, and EA4 and the non-light emitting area NEA1, NEA2, NEA3, and NEA4.

One proposed method for fabricating a display device includes providing a spacer to maintain a cell gap between the first base substrate and the second base substrate. However, in accordance with at least one embodiment, the method of the present embodiment includes the filling pattern and the conductive layer instead of the separate cell gap. The filling pattern and the conductive layer may maintain the cell gap between the first and second base substrates. Thus, the method for fabricating a display device according to the present embodiment does not require a separate process for providing the spacer. As a result, the fabrication process may be simplified.

Moreover, since the filling pattern in the present embodiment is connected to the conductive layer and the cathode and includes the conductive material having a lower resistance than the conductive layer, the resistance of the cathode may be reduced. As a result, the voltage drop that otherwise may occur in the cathode of the display device may be prevented, and the conductive layer and the filling pattern may maintain the uniform voltage distribution of the cathode. Therefore, the power consumption for driving the display device according at least one embodiment may be reduced and light emitting efficiency may be enhanced. Moreover, even when the cathode is formed to have a large area, a uniform display quality may be realized over the entire surface.

In accordance with one or more embodiments, a display device is provided in which a voltage drop in a cathode may be prevented and light emitting efficiency may be improved. Also, fabrication method is provided which prevents a voltage drop from occurring in a cathode, thereby allowing for improved light emitting efficiency and simplifying the fabrication process.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present embodiment set forth in the claims.

What is claimed is:

1. A display device, comprising:
a first base substrate;
an organic electroluminescent device on the first base substrate;
a second base substrate on the organic electroluminescent device and including a light emitting area and a non-light emitting area;
a base layer between the organic electroluminescent device and the second base substrate;
a conductive layer between the base layer and the organic electroluminescent device; and
a filling pattern between the base layer and the conductive layer and overlapping a portion of the conductive layer, wherein:
the conductive layer overlaps the light emitting area and the non-light emitting area, covers the filling pattern, and contacts the base layer,
a portion of the conductive layer contacts the organic electroluminescent device, and
the filling pattern includes a first filling pattern including an insulating material and a second filling pattern on the first filling pattern, the second filling pattern including a conductive material having a lower resistance than the conductive layer.

2. The display device as claimed in claim 1, wherein the insulating material includes a photoresist.

3. The display device as claimed in claim 1, wherein the conductive material includes at least one of a metal or a metal alloy.

4. The display device as claimed in claim 1, wherein the conductive material includes at least one of aluminum (Al), copper (Cu), or silver (Ag), or includes an alloy thereof.

5. The display device as claimed in claim 1, wherein the conductive layer includes a transparent conductive oxide.

6. The display device as claimed in claim 1, wherein the filling pattern is spaced apart from the light emitting area and overlaps the non-light emitting area.

7. The display device as claimed in claim 1, wherein the width of the filling pattern is less than the width of the non-light emitting area.

8. The display device as claimed in claim 1, wherein the conductive layer includes:
a first conductive area protruding from the base layer toward the first base substrate and accommodating the filling pattern; and
a second conductive area connected to the first conductive part.

9. The display device as claimed in claim 8, wherein:
at least a portion of the first conductive area contacts the organic electroluminescent device, and
the second conductive area is spaced apart from the organic electroluminescent device.

10. The display device as claimed in claim 1, wherein the organic electroluminescent device includes:
an anode;
a light emitter on the anode to emit white light; and
a cathode on the light emitter, wherein the portion of the conductive layer contacts the cathode.

11. The display device as claimed in claim 10, wherein the light emitter includes:
a first light emitting layer;
a charge generating layer on the first light emitting layer; and
a second light emitting layer on the charge generating layer.

12. The display device as claimed in claim 10, wherein the light emitter includes:
a first light emitting layer;
a charge generating layer on the first light emitting layer;
a second light emitting layer on the charge generating layer; and
a third light emitting layer on the second light emitting layer and contacting the second light emitting layer.

13. The display device as claimed in claim 10, wherein the light emitter includes:
a first light emitting layer;
a first charge generating layer on the first light emitting layer;
a second light emitting layer on the first charge generating layer;
a second charge generating layer on the second light emitting layer; and
a third light emitting layer on the second charge generating layer.

14. The display device as claimed in claim 1, wherein the organic electroluminescent device emits white light.

15. The display device as claimed in claim 1, wherein the base layer includes at least one of a color filter layer or an overcoat layer.

16. The display device as claimed in claim 1, wherein the base layer includes a color filter layer that has a color filter and a black matrix, at least a portion of the filling pattern overlapping the black matrix.

* * * * *